United States Patent [19]

Seki et al.

[11] Patent Number: 5,145,554
[45] Date of Patent: Sep. 8, 1992

[54] METHOD OF ANISOTROPIC DRY ETCHING OF THIN FILM SEMICONDUCTORS

[75] Inventors: Tetsuya Seki; Tatsuya Asaka; Takashi Takamura, all of Suwa, Japan

[73] Assignee: Seiko Epson Corporation, Japan

[21] Appl. No.: 484,786

[22] Filed: Feb. 22, 1990

[30] Foreign Application Priority Data

| Feb. 23, 1989 | [JP] | Japan | 1-43476 |
| Apr. 10, 1989 | [JP] | Japan | 1-90308 |
| May 12, 1989 | [JP] | Japan | 1-119720 |
| May 12, 1989 | [JP] | Japan | 1-119721 |
| May 12, 1989 | [JP] | Japan | 1-119728 |
| May 12, 1989 | [JP] | Japan | 1-119732 |
| May 15, 1989 | [JP] | Japan | 1-120713 |
| May 30, 1989 | [JP] | Japan | 1-136802 |
| Jul. 4, 1989 | [JP] | Japan | 1-172340 |
| Feb. 19, 1990 | [JP] | Japan | 2-37935 |
| Feb. 19, 1990 | [JP] | Japan | 2-379341 |

[51] Int. Cl.⁵ .................................. H01L 21/00
[52] U.S. Cl. ................... 156/643; 156/646; 156/626; 156/659.1; 156/661.1; 204/192.34; 204/192.35
[58] Field of Search ............. 156/643, 646, 661.1, 156/659.1, 656, 652, 664, 626, 627; 204/192.33, 192.35, 192.34

[56] References Cited

U.S. PATENT DOCUMENTS

| 4,174,219 | 11/1979 | Andres et al. | 156/659.1 X |
| 4,361,461 | 11/1982 | Chang | 156/643 |
| 4,595,453 | 6/1986 | Yamazaki et al. | 156/659.1 X |
| 4,609,428 | 9/1986 | Fujimura | 156/643 |
| 4,622,094 | 11/1986 | Otsubo | 156/627 |
| 4,639,301 | 1/1987 | Doherty et al. | 204/192.31 |
| 4,640,737 | 2/1987 | Nagasaka et al. | 156/643 |
| 4,734,157 | 3/1988 | Carbaugh et al. | 156/643 |
| 4,734,158 | 3/1988 | Gillis | 156/643 |
| 4,778,561 | 10/1988 | Ghanbari | 156/643 |
| 4,795,529 | 1/1989 | Kawasaki et al. | 156/643 |
| 4,838,984 | 6/1989 | Luttmer et al. | 156/643 |
| 4,859,908 | 8/1989 | Yoshida et al. | 315/111.81 |
| 4,874,459 | 10/1989 | Coldren et al. | 156/643 |

FOREIGN PATENT DOCUMENTS

| 291032 | 6/1987 | Japan . |
| 259443 | 11/1987 | Japan . |
| 122219 | 12/1987 | Japan . |
| 110733 | 5/1988 | Japan . |

OTHER PUBLICATIONS

M. W. Geis et al., "A Novel Anisotropic Dry Etching Method", *Journal of Vacuum Science Technology*, vol. 19(4), pp. 1390-1393, Nov./Dec. 1981.

M. W. Geis et al., "Hot-Jet Etching of Pb, GaAs, and Si", *Journal of Vacuum Science Technology*, vol. B 5(1), pp. 363-365 Jan./Feb. 1987.

(List continued on next page.)

*Primary Examiner*—Thi Dang
*Attorney, Agent, or Firm*—W. Douglas Carothers, Jr.

[57] ABSTRACT

A microwave ECR plasma etching method and apparatus, including a plasma generating chamber coupled to a separate treatment chamber for supporting a Group II-VI sample to be dry etched, are tailored for the dry etching of Group II-VI compound semiconductors resulting in highly anisotropic etched patterns in Group II-VI materials having vertical side walls taking advantage of the ionicity of the constituents of Group II-VI compounds and utilizing a low ion energy level which will not damage the crystalline integrity of the Group II-VI material. The apparatus may further include counter bias means and/or transverse magnetic field means in a region between the plasma generating chamber and the treatment chamber to improve the reactionary quality of the species and lower the energy level of the species without losing control and directionality of the species flow into the treatment chamber thereby preventing damage to the crystalline structure of the etched II-VI sample.

29 Claims, 11 Drawing Sheets

OTHER PUBLICATIONS

M. W. Geis et al., "Summary Abstract: Etching with Direct Beams of Ions or Radicals", *Journal of Vacuum Science Technology*, vol. B 5(4), pp. 1928–1929, Jul.-/Aug. 1987.

K. Asakawa et al., "GaAs and GaAlAs Equi-Rate Etching Using a New Reactive Ion Beam Etching System", *Japanese Journal of Applied Physics*, vol. 22(10), pp. L653–L655, Oct., 1983.

E. M. Clausen et al., "Etching and Cathodoluminescence Studies of ZnSe", *Applied Physics Letter*, vol. 53(8), pp. 690–691, Aug., 1988.

K. Asakawa et al., "GaAs and GaAlAs Anisotropic Fine Pattern Etching Using a New Reactive Ion Beam Etching System", *Journal of Vacuum Science Technology*, vol. B 3(1), pp. 402–405, Jan./Feb. 1985.

K. Asakawa et al., "Optical Emission Spectrum of $C_2l$ ECR Plasma in the GaAs Reactive Ion Beam Etching (RIBE) System", *Japanese Journal of Applied Physics*, vol. 23(3), pp. L156–L158, Mar., 1984.

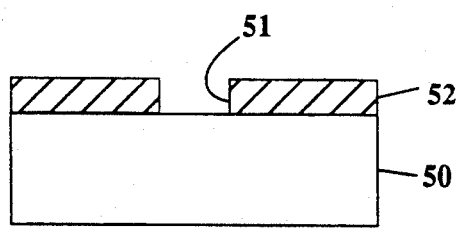
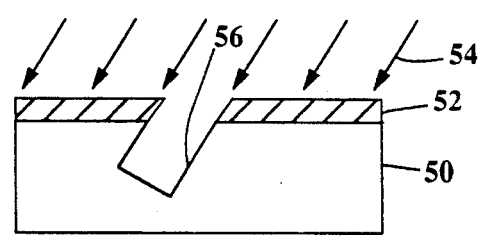
FIG. 8A                FIG. 8B
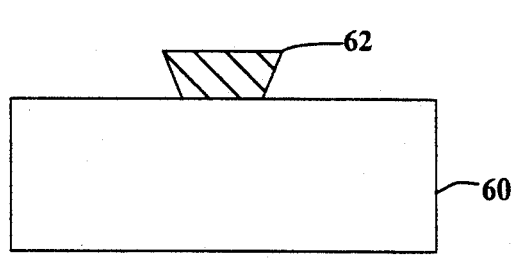
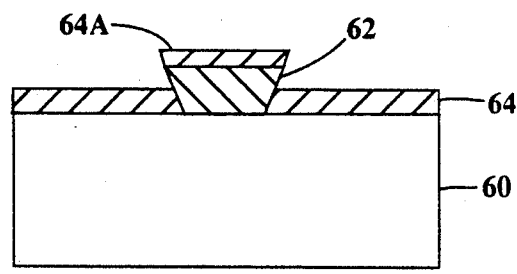
FIG. 9A                FIG. 9B
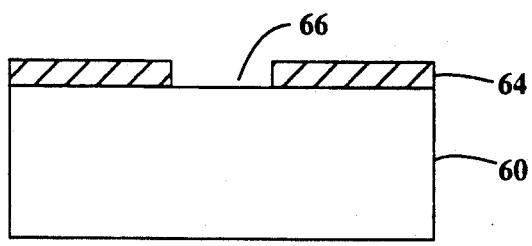
FIG. 9C
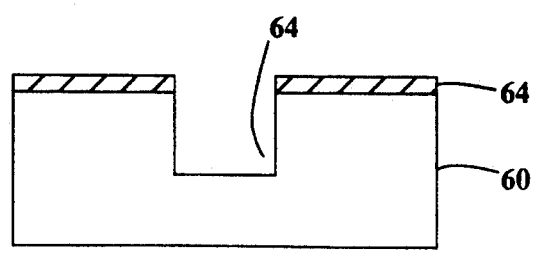
FIG. 10

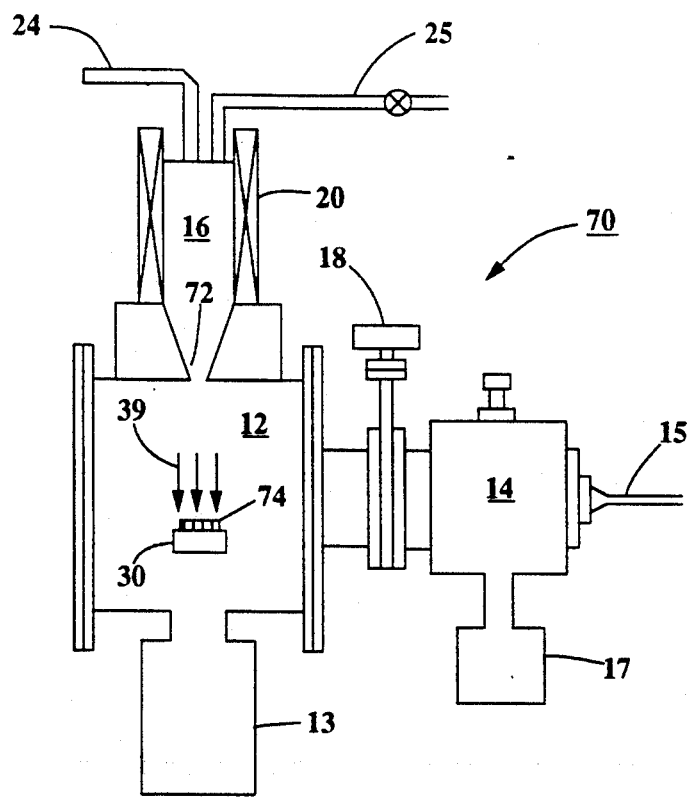
FIG. 11
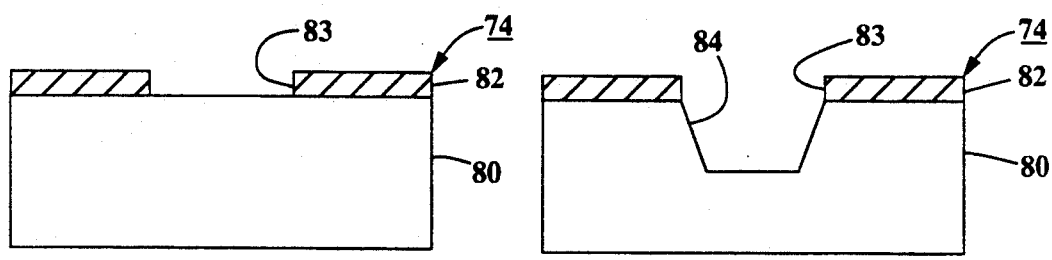
FIG. 12A  FIG. 12B
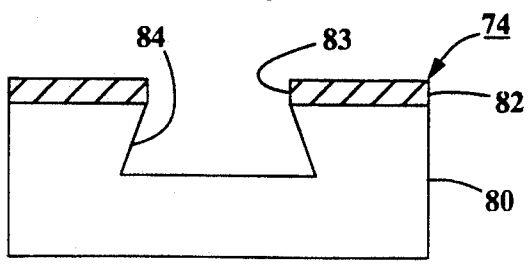
FIG. 12C

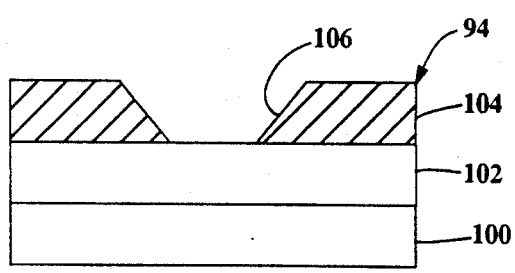 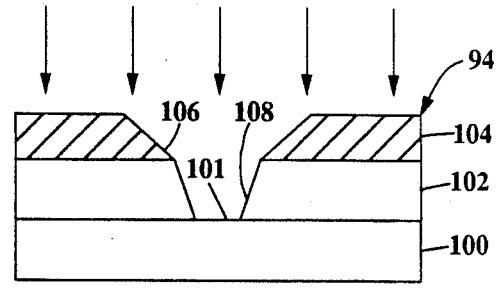
FIG. 17A  FIG. 17B
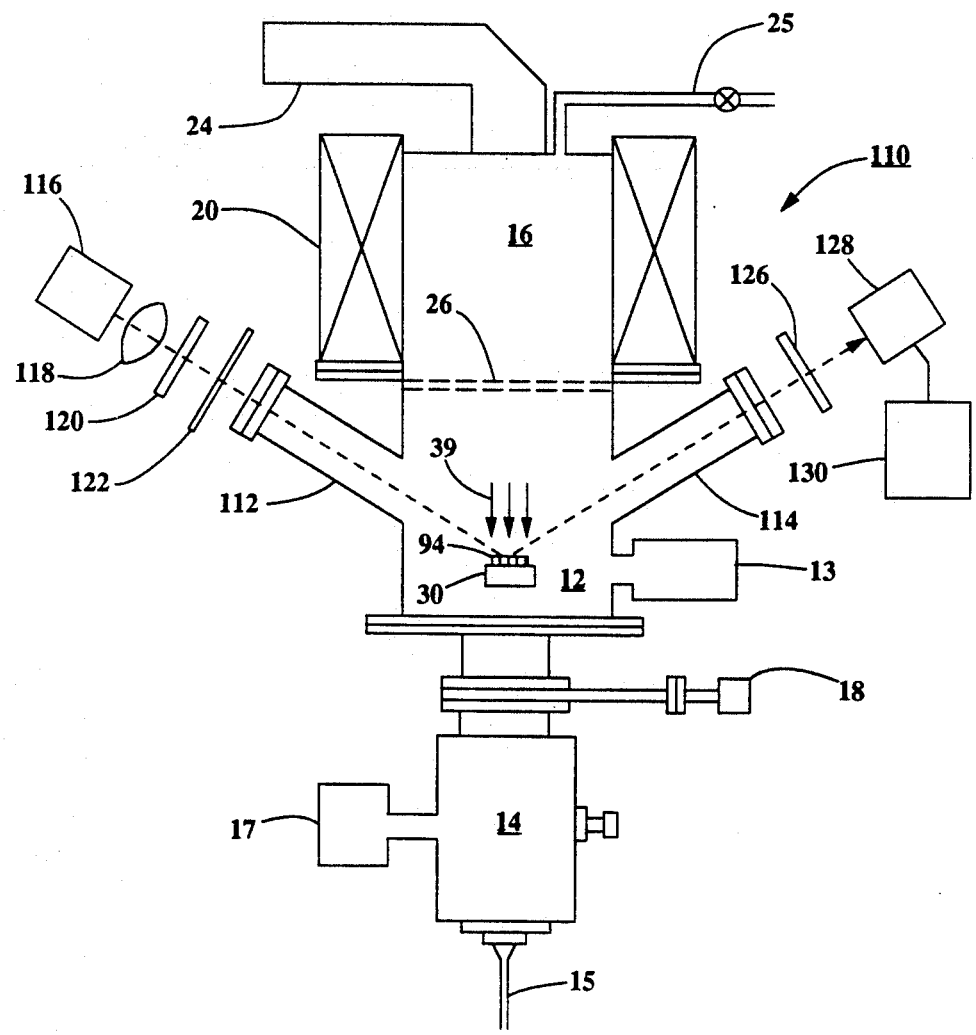
FIG. 18

METHOD OF ANISOTROPIC DRY ETCHING OF THIN FILM SEMICONDUCTORS

CROSS REFERENCE TO RELATED APPLICATIONS

This application contains subject matter related to the subject matter of patent application Ser. Nos. 07/485,058 and 07/484,222 both filed Feb. 22, 1990 and assigned to the same assigned herein and incorporated herein by reference thereto.

BACKGROUND OF THE INVENTION

This invention relates generally to methods for etching treatment of semiconductor structures and more particularly to microwave plasma anisotropic dry etching of thin film semiconductor structures and, specifically, to microwave generated plasma methods of etching Group II-VI compound semiconductor thin films or substrates employing a halogen reactive gas medium to chemically etch patterned semiconductor layers or substrates of semiconductor structures without significant surface or structural damage.

The manufacture of semiconductor devices and structures usually requires the selective etching of particular patterns in specific layers thereof. Previously, most etching of this type was wet etching, i.e., employing wet chemical materials that are applied to the patterned surface. In wet etching of Group II-VI compound semiconductors, the etching solutions primarily used are a solution of sodium hydroxide; hydrochloric acid; and a compound solution of nitric acid, hydrochloric acid, and water. These etching solutions are used at appropriate temperatures and with appropriate composition ratios as known in the art to achieve desired etching rate. However, the use of wet etching is isotropic in nature so that the resultant linewidth and pattern resolution of the wet etched pattern is not the same as the originally desired resist pattern. Further wet etching requires additional treatment steps of rinse and drying. Because of these mentioned factors, semiconductor structure yields are not uniform or high.

A common problem relative to wet etching is the lack of reproducibility. A predetermined etching rate cannot be achieved unless the temperature and the composition of etching solution are closely controlled. Also, where the etching solution contains a volatile material, the composition of the solution significantly changes over time. Therefore, etching rate of the wet etchant at the time when the solution is prepared and etching rate of the wet etchant at some later time are dramatically different. Furthermore, in wet etching, the pattern to be etched in a semiconductor layer or film cannot be formed to be the same as pattern of the mask because the etching is isotropic in nature, including side etching, resulting in a larger overall etched pattern. Also, the etching of patterns of processed sections are limited, for example, formation of vertical sections or deep vertical grooves with large length/breadth ratio is difficult to obtain.

Wet etching of Group II-V group compound semiconductors present more problems than wet etching of other semiconductors, such as, Group III-V group compound semiconductors. For example, in the case wherein etching of ZnSe is performed employing a hydrochloric acid and nitric acid etching solution, the etching solution penetrates into ZnSe and it is very difficult to completely remove etchant even with long periods of rinsing. As a result, there is a substantial degradation of film characteristics. Also, in the case where etching of ZnSe or $ZnS_xSe_{1-x}$ ($0 < x \leq 1$) is performed in the solution of NaOH, the surface morphology worsens extremely, therefore, these compounds are not particularly suitable for precision wet etching compared to Group III-V compound semiconductors. In the case where hydrochloric acid is employed as an etchant, the etching rate is very slow and, therefore, HCl is not practical for use in the fabrication and selective etching of Group II-VI compound semiconductors.

For many years, sputtering and ion milling or etching have been employed as dry etching techniques to accomplish, among other things, etching of semiconductor layers. In general, processing is carried out by establishing a DC or rf generated plasma with an inert atmosphere, such as Ar. An example of such processes are disclosed in U.S. Pat. No. 4,622,094. These techniques generally involve the formation of a plasma and the physical removal of materials from the semiconductor surface due to bombardment of the surface with ions. However, the accuracy of these techniques has left much to be desired, particularly relative, for example, to improvements to pattern resolution, surface morphology, attained anisotropy, etching depth and reduced mask erosion.

On the other hand, in the case of such dry etching, for example, ion etching employing an inert gas medium, such as Ar, in order to enhance the etching rate to a level of practical utilization, it is necessary to increase the plasma discharge power. However, this, in turn, results in substantial damage to a semiconductor materials.

More recently, there has been an increased interest in reactive dry etching techniques because these techniques, as compared to the above mentioned previous techniques, promise better pattern resolution in submicron large scale integration providing a higher degree of circuit density with improvements in surface morphology, increased anisotropy, lower thermal stress due to lower temperature processing, higher plasma densities at lower pressures, enhanced etching rates, enhanced selectivity ratio, deeper etching capability and reduced mask erosion. Further, they eliminate the need for the above mentioned post etching treatment steps employed in wet etching and improved to a great degree the accuracy can be achieved in the resultant linewidth and pattern resolution. As a result, semiconductor structure yields may be made more uniform and higher. These techniques generally involve the chemical removal of materials from the semiconductor surface or a combination of chemical and physical removal from the semiconductor surface comprising atoms or molecules of etched materials and products of the reaction between surface molecules and the reactive gas species.

Dry etching techniques include reactive ion etching (RIE), ion beam assisted etching (IBAE) and hot jet etching (HJE), and reactive ion beam etching (RIBE), such as microwave plasma dry etching, each of which involves a chemically reactive vapor or gaseous species, for example, comprising a halogen, such as $F_2$, $Br_2$ or $Cl_2$, in a vapor phase compound. In RIE, the sample or target to be etched is placed on a cathode in an electric field established between an anode and cathode in the presence of a selected flux of a chemically reactive species that reacts with atoms or molecules on the surface of the sample. The potential applied between the anode and cathode is sufficient to ionize atoms or molecules in the gas as well as produce radicals. The positively charged ions produced in the plasma are attracted to the cathode and upon impact physically remove or etch away material from the sample surface. The reactive species will also chemically react with atoms or molecules on the surface of the sample which are also removed by the incident ions on the surface of the sample. As an example of RIE, see U.S. Pat. No. 4,640,737.

In the case of reactive ion etching (RIE) employing a reactive gas, such as $BCl_3$, damage to the semiconductor materials is, to a degree, less compared to that of ion etching. In any case, damage to the surface of semiconductor materials under this etching treatment is still major and not acceptable. In order to reduce the damage, the gas pressure of the etching system may be raised while lowering the discharge power. However, the ion sheath width and the mean free path of the ions and neutral particles become almost the same, causing the beam of ions to lose directionality thereby increasing the potentiality of isotropic etching to occur. Thus, RIE provides a significant drawback to dry etch processing particularly for Group II-VI compound semiconductors.

In IBAE, a combination of ions from an inert gas, e.g., $Ar_+$, from an ion beam source and a flux of chemically active species, e.g., F or Cl, are directed to the sample and by control of the ion beam and the reactive species, a controlled anisotropic etching can be carried out. In the case of HJE, there is no ion beam employed and a flux of reactive radicals is formed and directed onto the sample. See, for example, the articles of M. W. Geis et al.: "A Novel Anisotropic Dry Etching Technique", *Journal of Vacuum Science Technology*, Vol. 19(4), pp. 1390-1393, Nov./Dec., 1981; "Hot-Jet Etching of Pb, GaAs, and Si", *Journal of Vacuum Science Technology*, Vol. B5(1), pp. 363-365, Jan./Feb., 1987; and "Summary Abstract: Etching With Directed Beams of Ions or Radicals", *Journal of Vacuum Science Technology*, Vol. A5(4), pp. 1928-1929, Jul./Aug. 1987. Also, see U.S. Pat. No. 4,874,459 relative to a modified IBAE method as well as a summary of other reactive dry method techniques mentioned in the background of this reference.

In RIBE, the source of ions (e.g., $Cl^+$) and radicals (e.g., $Cl^*$) is generally formed in and extracted out of a separate chamber and accelerated via an ion extraction grid or electrode into the etching chamber. See, for example, the article of K. Asakawa et al., "GaAs and GaAlAs Equi-Rate Etching Using a New Reactive Ion Beam Etching System", *Japanese Journal of Applied Physics*, Vol. 22(10), pp. L653-L655, Oct. 1983. Electron Cyclotron Resonance (ECR) microwave plasma source is employed which provides for higher efficiency in plasma generation and higher generation of reactive species achieving improved anisotropy and higher etching rates. Other examples are found in U.S. Pat. Nos. 4,795,529; 4,778,561; 4,609,428; 4,859,908 and 4,734,157.

Thus, reactive dry etching processes generically provide a source of reactive species in the form of either reactive ions, e.g. $Cl^+$, or reactive radicals, e.g. $Cl^*$, or a combination of reactive ions and radicals forming a reactive flux, e.g. $Cl^+$ and $Cl^*$, or a source of reactive species assisted by other ions, e.g. $Cl^+$ and/or $Cl^*$ in combination with $Ar^+$, that are generated, focussed and/or accelerated to the sample target to provide a chemical action at the sample surface with surface molecules and sputter or otherwise remove reaction products from the sample surface via the outlet affluent.

It is of importance to note that all of the foregoing references relating to various dry etching techniques are methods that have specifically evolved for the purpose of etching Group III-V materials, e.g., GaAs and AlGaAs. The techniques have not been generally applied to Group II-VI compound semiconductors, such as ZnSe, ZnS, or $ZnS_xSe_{1-x}$, because the developed treatments, as reported in these references, have not been designed for these compounds and their attempted application according to their specific teachings would provide etching rate that are not of a practical level and would result in damage to the crystalline structure without good anisotropy. Further, problems persist in the utilization of these etching techniques of the prior art, particularly in the case of Group II-VI compound semiconductors wherein both selective wet etching and dry etching techniques have been used employing a mask comprising an insulation film, such as photoresist, $SiO_2$, or the like. In particular, good anisotropy has not been obtained, particularly in connection with masking techniques, and good selectivity ratio has not been achieved.

It is an object of this invention to provide an improved method of reactive ion beam etching (RIBE).

It is another object of this invention to provide a reactive ion beam etching (RIBE) method particularly suitable for Group II-VI compound semiconductors.

It is another object of this invention to provide modified reactive ion etch methods from high density plasmas including a combination of reactive gases to form the reactive gas medium providing for high anisotropy, enhanced etching properties and much improved surface morphology, particularly for Group II-VI compound semiconductors.

It is a further object of this invention to manufacture semiconductor structures employing Group II-VI compound semiconductors with excellent reproducibility by providing etching methods of Group II-VI compound semiconductors with high reproducibility, excellent practical use with no or negligible damage to etched semiconductor materials and with a capability of producing anisotropically patterns previously not realizable in the prior art.

SUMMARY OF THE INVENTION

According to this invention, a microwave ECR plasma etching method and apparatus, comprising a plasma generating chamber coupled to a separate treatment chamber for supporting a Group II-VI sample to be dry etched, are tailored for the dry etching of Group II-VI compound semiconductors resulting in highly anisotropic etched patterns in Group II-VI materials having vertical side walls taking advantage of the ionicity of the constituents of Group II-VI compounds and utilizing a low ion energy level which will not damage the crystalline integrity of the Group II-VI material. The apparatus may further include counter bias means and/or transverse magnetic field means in a region between the plasma generating chamber and the treatment chamber to improve the reactionary quality of the species and lower the energy level of the species without losing control and directionality of the species flow into the treatment chamber thereby preventing damage to the crystalline structure of the etched II-VI sample.

The present invention demonstrates superior effects by providing ion and/or radical species produced from a plasma formed from a reactive gas medium containing a halogenate to etch Group II-VI compound semiconductors, such as ZnSe, ZnS, or $ZnS_xSe_{1-x}$, recognizing the fact that these compound semiconductors have higher ionicity than Group III-V compound semiconductors. Thus, in order to employ a RIBE method, it is necessary to take into consideration this ionicity if good anisotropy and minimal crystalline damage are to be attained. For example, if the particular disclosed treatment of Asakawa et al. for RIBE were to be utilized in connection with Group II-VI compound semiconductors, unacceptable levels of damage would generally occur.

We have discovered that since the ionicity of the constituents comprising Group II-VI compound semiconductors are high, they react much more readily with active halogen elements, such as Cl, compared to III-V compound semiconductors. As indicated from the work of Asakawa et al. and others, the etching mechanism of the RIBE method involves (1) the chemical adsorption of halogen ions or radicals to the surface of the sample to be dry etched, (2) chemical reaction with the sample constituents and (3) physical removal of reaction products from the sample surface constituents or materials. However, in the case of Group II-VI compound semiconductors, the removal of reaction products from the surface materials is by vapor pressure. As a result, the etching rate is large for a lower ion energy level, e.g., employing an acceleration or lead voltage in the range of 0 V to 600 V, preferably below 300 V, compared to ion energy levels employed in the case of Group III-V compound semiconductors. With the application of lower ion energy levels while achieving a comparable or acceptable etching rate for practical use relative to etching Group II-VI compound semiconductors, correspondingly, damage to the crystalline structure is minimized or negligible.

Further, the constituents of Group II-VI compound semiconductors form reaction products which, in most cases, produce two halogen reaction products. For example, in the case of RIBE dry etching of ZnSe with Cl ions, the reaction products are $ZnCl_x$ and $SeCl_x$, such as, $ZnCl_2$ and $SeCl_2$. From a chemical point of view, these reaction products are not very active. Therefore, after they are formed at the sample surface and evaporate, they will be swiftly carried away due to the vapor pressure of the system and will not side etch the side walls of the masked pattern being etch in the sample because of their low reactive nature and their swift removal. As a result, clean anisotropic etching in the direction of the applied ion beam is achieved. Compared to the reaction products formed relative to Group III-V compound semiconductors employing the RIBE method and Cl ions, such as $GaCl_2$, $GaCl_3$ and the like, after these reaction products evaporate, they may still producing side etching of the side walls of the pattern being etch in the sample because of their high reactive nature prior to their removal from the immediate region of the sample surface. Thus, the application of the RIBE method to Group II-VI compound semiconductors under the proper controlled conditions provides for enhanced anisotropic etching compared to Group III-V compound semiconductors.

Employing reactive ion beam etching produced by microwave excitation and an ECR plasma of Group II-VI compound semiconductors, as compared to the wet etching technique or dry etching, such as, IRE or RIBE methods of the prior art, provides for superior reproducibility and controllability in the process. In particular, damage to semiconductor materials is dramatically reduced. Further, by controlling the ion beam and the shape of the etching mask, precision process of, for example, grooves with taper or vertical walls having perpendicular cross section or diagonal groove is fully possible. Furthermore, since etching rate can be controlled by choosing from various reactive gas and the stability of plasma can be achieved, etching depth can be controlled with good reproducibility. Also, good morphology, such as, extremely smooth etching side surfaces, and achievement of the exact, desired etching pattern of the mask pattern are obtainable.

Under the methods of this invention, the etching process can be carried out under low pressure and low density conditions thereby reducing to a minimum damage to the crystalline structure and, further, the point of etching termination can be precisely determined. Therefore, regardless of the chosen etching rate, etching to a desired interface, for example, can be detected with precision and in a reproducible manner. Thus, reproducibility between batches in dry etching of Group II-VI compound semiconductors is dramatically increases, thereby rendering simplified mass production of semiconductor integrated circuits and devices employing Group II-VI compound semiconductors.

Other objects and attainments together with a fuller understanding of the invention will become apparent and appreciated by referring to the following description and claims taken in conjunction with the accompanying drawings.

BRIEF DESCRIPTION OF THE DRAWINGS

FIGS. 8A and 8B are schematic cross sectional illustrations of a ZnSe semiconductor sample for the purpose of illustrating the directional nature of the application of the etching method comprising this invention.

FIGS. 9A through 9C are schematic cross sectional illustrations of a ZnSe semiconductor sample for the purpose of illustrating a masking technique employed in the pratice of the etching method comprising this invention.

FIG. 10 is a schematic cross sectional illustration of a ZnSe semiconductor sample for the purpose of illustrating the etching method comprising this invention.

FIG. 11 is a schematic cross sectional illustration of another microwave reactive ion etching apparatus employed in the practice of this invention.

FIGS. 12A through 12C are schematic cross sectional illustrations of a ZnSe semiconductor samples for the purpose of illustrating the etching method comprising this invention as practiced in the apparatus shown in FIG. 11.

FIGS. 17A and 17B are schematic cross sectional illustrations of a ZnSe semiconductor samples for the purpose of illustrating the etching method comprising this invention as practiced in the apparatus shown in FIG. 16.

FIG. 18 is a schematic cross sectional illustration of an even further microwave plasma etching apparatus employed in the practice of this invention equipped to monitor etched film depth via ellipsometry.

DESCRIPTION OF THE PREFERRED EMBODIMENTS

Figure 1:
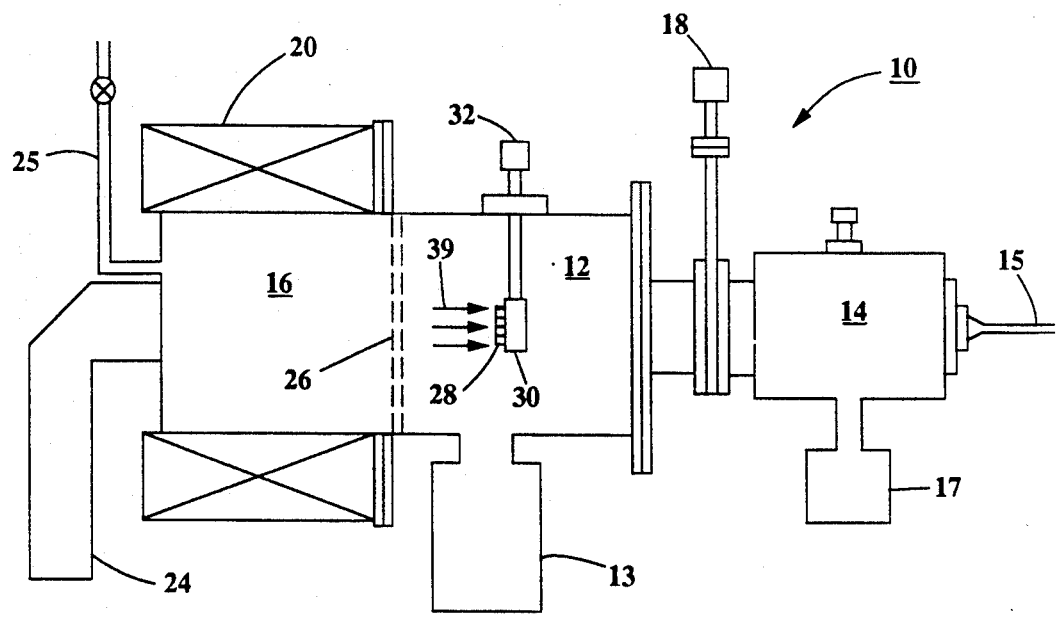
FIG. 1 is a schematic cross sectional illustration of a microwave plasma etching apparatus employed in the practice of this invention.

Reference is now made to FIG. 1 wherein there is shown a cross sectional schematic view of a microwave plasma etching apparatus 10 employed in connection with this invention. Apparatus 10 comprises an etching chamber 12 coupled to a sample preparation chamber 14 by means gate valve interlock 18. A highly pure, halogen gaseous element, e.g., $Cl_2$, is employed in the practice of this invention and is highly reactive so that these two chambers 12 and 14 are maintained under separate environments and valve 18 is opened when passing a sample 28 to and from chamber 12 from and to preparation chamber 14 via sample transfer rod 15. Chamber 14 has its own UHV evacuation system 17. The air locked etching chamber 12 is maintained under high vacuum condition via an UHV evacuation system 13.

Etching chamber 12 is directly open to ECR plasma chamber 16 which produces a high intensity plasma which is excited by a combination microwave, introduced into chamber 16 via microwave waveguide 24 and quartz plate window (not shown), and a magnetic filed provided by cylindrical magnetic coil 20. Also, a highly pure halogen gas, such as $Cl_2$, forming one component of the reactive gas medium is introduced via inlet 25. Another component of the reactive gas medium, such as, Ar, H or N, or combinations thereof may be introduced in another inlet (not shown). For the purposes of initial explanation and background, however, reference will be made only to the use of $Cl_2$ via inlet 25.

The microwave power from waveguide 24 creates discharges in the $Cl_2$ gas in chamber 16 and a plasma is generated which contains electrons, ions and radicals. Electrons, generated by the microwave, repeatedly collide with gas molecules and atoms while performing cyclotron movement within chamber 16 caused by the symmetric magnetic field produced by coil 20. When the intensity of the generated magnetic field is, for example, 875 Gauss, the revolution cycle matches with the microwave frequency, for example, 2.45 GHz, and a cyclotron resonance phenominum is created and resonance is achieved in electron absorption of microwave energy. Therefore, discharge continues even when gas pressure is low, thereby providing a high plasma density and a long and useful life for the reactive gas medium. Also, because the electrons and ions are in cyclotronic motion and are gather toward the center of chamber 16 because of the established electric field distribution, any sputtering effect produced by the ions on the side walls of plasma chamber 12 is minimal and, thus, provides a pure plasma which is unidirectional and perpendicular to the planar extent of sample 28 in etching chamber 10.

The ions and radicals generated in plasma chamber 16 generally have linear motion while the electrons have cyclotron motion and are retained within plasma chamber 16. However, the ions and radicals are accelerated as a beam by extraction grid or electrode 26 toward sample 28 in a path perpendicular to the planar extent of sample 28 when applied acceleration or lead voltage is applied to electrode 26. The ions and radicals impinging sample 28 chemically react with the surface material of sample 28 and form volatile products which are removed from region of sample 28 by the sputtering action of the ions and evacuated from chamber 10 via evacuation system 13.

Sample 28 is supported on sample holder 30 in chamber 10. Holder 30 may be rotated 360° about a vertical axis by manipulator 32 so that the direction of the beam emanating from chamber 16 can be made incident at an angle relative to the planar extent of sample 28. Also, holder 30 may be provided with a heater/cooling section (not shown) for the purpose of heating or cooling sample 28 to a controlled predetermined temperature.

Figure 2A:
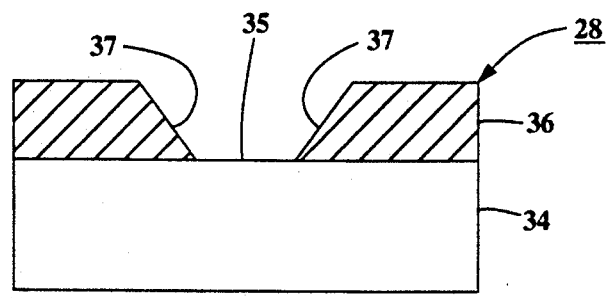
FIGS. 2A and 2B are schematic cross sectional illustrations of a ZnSe semiconductor sample, respectively before and after dry etching, which is employed in several embodiments for the purpose of illustrating the application of the method of this invention as practiced relative to the apparatus shown in FIG. 1.

FIG. 2A illustrates a cross sectional view of a sample 28 prior to etching in accordance with the method of this application. Sample 28 comprises substrate 34 of a Group II-VI compound semiconductor, e.g., ZnSe. While this example, as well as subsequently discussed samples, illustrates a Group II-VI compound semiconductor substrate, the sample may also be a Group II-VI compound semiconductor layer or a plurality of layers. A mask 36 comprising, for example, a positive type photoresist material, is formed on substrate 34 and a desired pattern 35 is formed in mask 36 employing conventional photolithography. Since mask 36 is formed by conventional photolithography, the cross sectional pattern of mask 36 will have a natural taper shape, as illustrated at 37.

A method of dry etching for sample 28 utilizing apparatus 10 was performed as follows relative to a first embodiment of this invention. Chlorine gas was employed as the reactive gas medium and this medium was 99.999% pure chlorine. The gas pressure of the system was $1.0 \times 10^{-1}$ Pa, the microwave inlet power was 100 W, the lead voltage was 500 V, the sample temperature was 25° C., and the direction of ion beam irradiation (indicated by arrows 39 in FIGS. 1 and 2B) was perpendicular relative to the planar extent of sample 28.

Figure 2B:
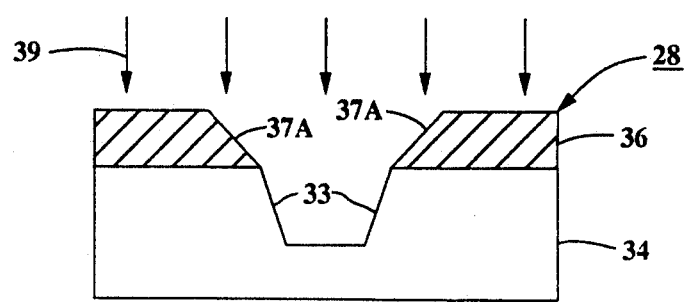

FIG. 2B illustrates a cross sectional view of sample 28 after etching. The etching rate of ZnSe was approximately 600 Å/min. while the etching rate of the positive type photoresist, comprising mask 36, was approximately 200 Å/min. This mask etching rate is applicable in the case where the mask had been post baked for 30 minutes at 120° C. The etching rate varies to a certain degree depending upon the type of photoresist employed and the baking conditions, e.g., temperature and time, employed, particularly the temperature. A sufficiently good selectivity ratio is obtained if the photoresist baking temperature is in the range of about 120° C. to 250° C. Since the pattern of etching mask 36 has a taper shape 37 and sputtering effect of the beam also causes slight etching of etching mask 36. This is evident in FIG. 2B in that mask 36 has been reduced in thickness and its taper 37A is more pronounced compared to FIG. 2A. Also, the etched region of ZnSe in sample 28 is also taped as shown at 33. Thus, even where the ion beam is irradiated perpendicularly relative the planar extent of ZnSe sample 28, a perpendicular cross section cannot be achieved in the ZnSe material, i.e., anisotropic etching is not obtained in spite of the normal incident of ion beam 39 on sample 28. On the other hand, for practical use in etching applications, the etching rate achieved in this embodiment is sufficient. Further, the uniformity in distribution of the etching rate on the etched material across the extent of the sample surfaces in the case where the substrate sample size was 20 mm×20 mm was about or less than ±5%, and the surface morphology of the sample was about the same as the surface morphology before etching treatment.

Figure 3A:
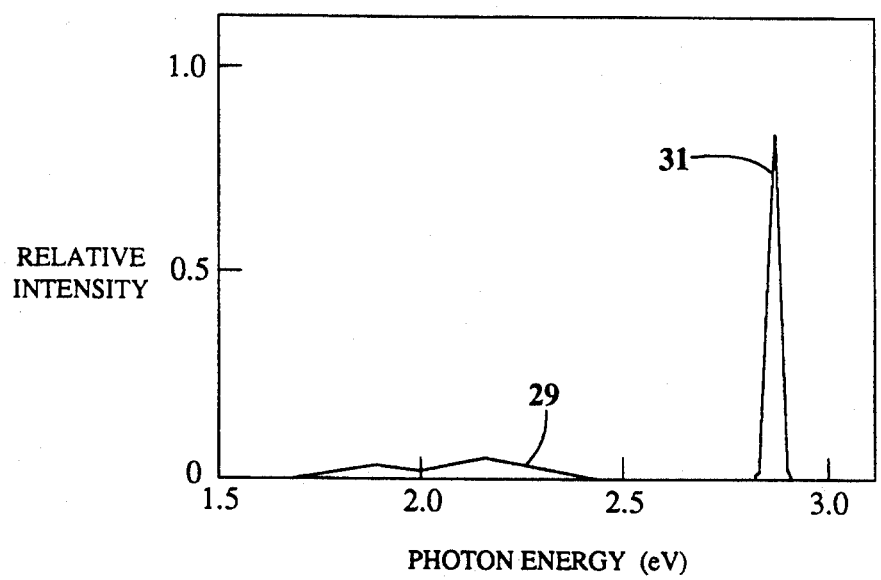
FIGS. 3A and 3B are graphic illustrations of the photoluminescence spectra for a ZnSe layer respectively before and after dry etching in accordance with the method of this invention.
Figure 3B:
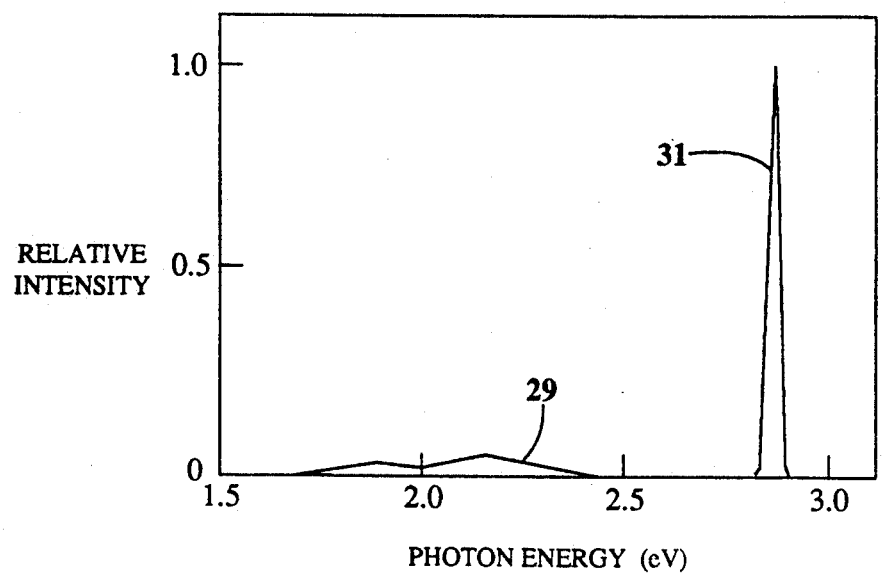

FIG. 3A and FIG. 3B illustrate the comparison of photoluminescence spectra of ZnSe substrate 34 before and after the etching under the above mentioned conditions. FIG. 3A is the photoluminescent spectra before etching and FIG. 3B is the photoluminescent spectra after etching. The deep level luminescence 29 and the band edge luminescence 31 are illustrated in each of these figures. The lower the deep level 29, the less crystalline damage that occurs to the sample material. Since the ratio of relative intensity of luminescence of the band edge 21 relative to the deep level 29 is approximately 50 both before and after etching, it is clear that there is essentially no damage resulting to semiconductor substrate 34.

Examples representing the effective etching conditions for practical applications relative to this original embodiment for use in processing Group II-VI compound semiconductor structures are now described.

Figure 4:
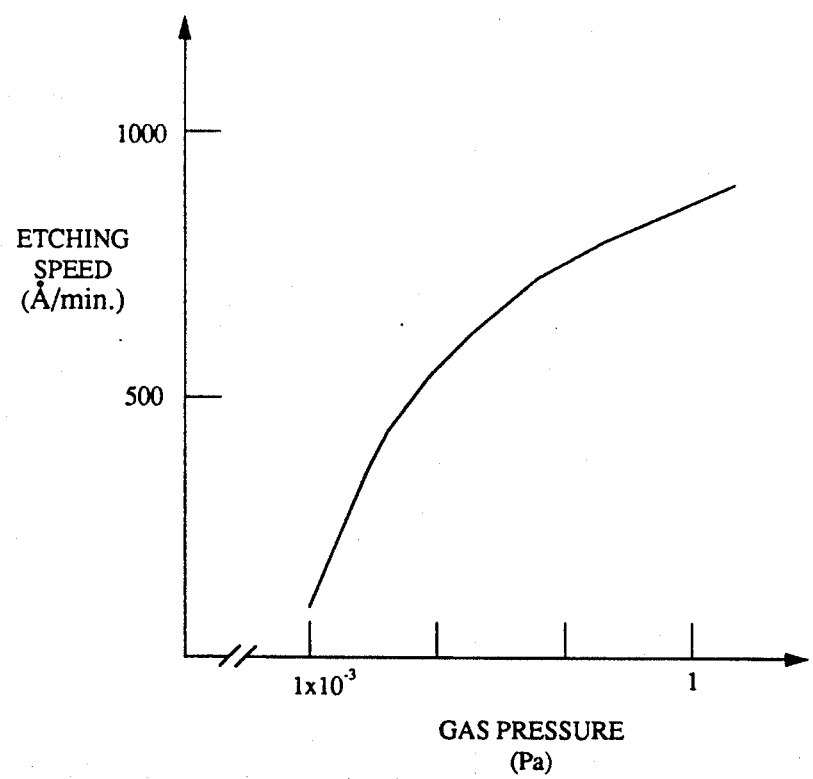
FIG. 4 is a graphic illustration of the relationship of the etching rate relative to the gas pressure in the practice of the method comprising this invention.

Qualitatively speaking, the etching rate increases as the gas pressure increases, as determined from experimental data illustrated in FIG. 4 wherein the lead voltage was maintained around 500 V and the microwave power was maintained around 80 W. However, when the gas pressure is too high, plasma discharge will not occur. Even when discharge occurs, such as at or above 1 Pa, the ion sheath width and the mean free path of the ions and radicals become substantially the same thereby causing the ion beam to lose its directionality. Therefore, these high pressure conditions are not suitable for etching treatment. When the gas pressure is too low, such as at or below $1 \times 10^{-3}$ Pa, the etching rate progresses too slow, therefore, it is not suitable for practical applications.

Table 1 shows the relationship of the etching rate of ZnSe relative to the gas pressure when the microwave inlet power is 100 W, the lead or acceleration voltage is 500 V and pure chlorine gas is employed as the etching gas medium. As can be seen from Table 1, as the gas pressure becomes lower, so does the etching rate and lateral (side) or isotropic etching is negligible or nonexistent. The term, "slight", in Table 1 may be expressed by a guideline indicative of the degree of lateral or side etching. If the mean depth of etching is A and the maximum depth of resultant lateral etching is B, then the degree of side etching is expressed as B/A. "Slight" lateral etching condition means that the ratio of $B/A \leq 0.1$. There is no practical problems relative to the use of etched II-VI compound semiconductors in the manufacture of semiconductor devices or IC structures with a ratio of $B/A \leq 0.1$.

Figure 5:
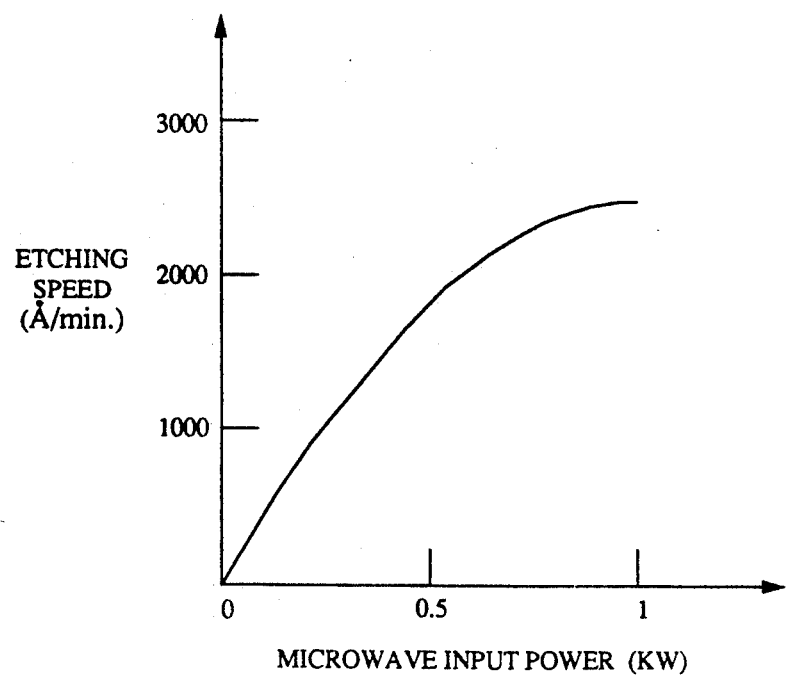
FIG. 5 is a graphic illustration of the relationship of the etching rate relative to the microwave input power in the practice of the method comprising this invention.

As determined from experimental data illustrated in FIG. 5, wherein the gas pressure was maintained around $1 \times 10^{-1}$ Pa and the lead voltage was maintained around 450 V, etching rate increases as the microwave inlet power increases because the plasma density becomes more intense as microwave excitation is increased. However, when the microwave inlet power is too high, the plasma temperature becomes too high deforming electrode 26. Also, temperature control of sample 28 becomes difficult because the sample temperature also rises due to the microwave power extending into etching chamber 12. Good etching results are, therefore, achieved with microwave power in the power range of 1 W to 1 KW.

TABLE 1

| Gas Pressure (Pa) | Etching Rate (Å/min) | Lateral Etching Condition |
|---|---|---|
| $5 \times 10^{-3}$ | 100 | None |
| $1 \times 10^{-2}$ | 500 | None |
| $5 \times 10^{-2}$ | 650 | None |
| $1 \times 10^{-1}$ | 700 | None |
| $5 \times 10^{-1}$ | 800 | Slight |
| 1.0 | 1,000 | Slight |

Table 2 shows the dependency characteristics of the etching rate of ZnSe relative to the microwave inlet power when the etching medium comprises pure chlorine gas, the gas pressure is $1 \times 10^{-1}$ Pa, and the lead voltage is 400 V. As can be seen in Table 2, the etching rate increases with the microwave inlet power.

TABLE 2

| Microwave Inlet Power (W) | Etching Rate (Å/min) |
|---|---|
| 50 | 200 |
| 100 | 700 |
| 150 | 900 |
| 200 | 1,000 |
| 400 | 1,300 |
| 600 | 1,900 |
| 1,000 | 2,100 |

Figure 6:
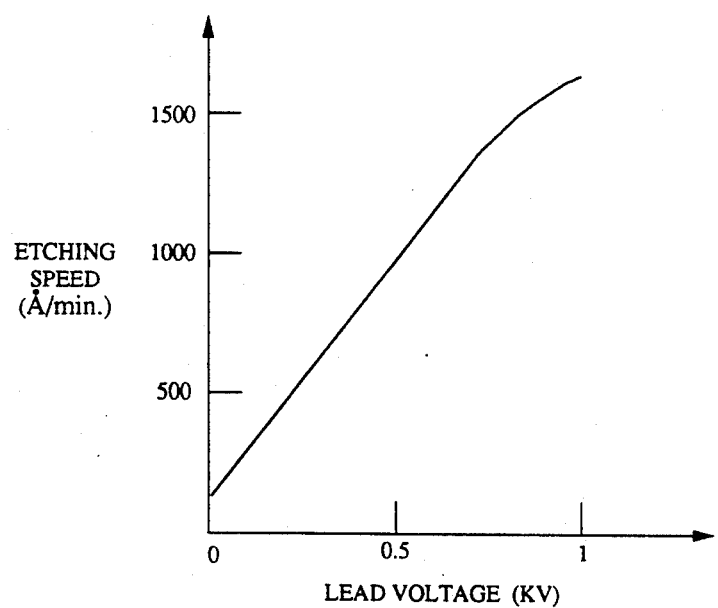
FIG. 6 is a graphic illustration of the relationship of the etching rate relative to the lead voltage in the practice of the method comprising this invention.

As illustrated in FIG. 6, wherein the gas pressure was maintained around $1 \times 10^{-1}$ Pa and the microwave power was maintained around 200 W, the etching rate increases as the lead voltage increases. However, if the voltage is too high, such as at or above 1 KV, physical sputtering of the sample becomes too strong causing substantial damage to the substrate crystalline structure. When lead voltage is 0 V, and the substrate temperature is approximately 200° C., etching by radical species of Cl is accomplished and isotropic etching of the sample will occur.

Table 3 shows the dependency characteristics of the etching rate of ZnSe relative to the lead voltage when the etching gas is pure chlorine gas, the gas pressure is $1 \times 10^{-1}$ Pa, and the microwave inlet power is 200 W. To be noted is that as the lead voltage increases, so does the etching rate and a point is reached, i.e., at about 700 V, when damage begins to occur to the crystalline structure of the sample.

TABLE 3

| Lead Voltage (V) | Etching Rate (Å/min) | Substrate Damage |
| --- | --- | --- |
| 200 | 500 | None |
| 300 | 700 | None |
| 400 | 850 | None |
| 500 | 1,000 | None |
| 600 | 1,200 | None |
| 700 | 1,300 | Slight |
| 800 | 1,500 | Slight |
| 1,000 | 1,600 | Yes |

FIG. 7 illustrates one sample embodiment of this invention utilizing the method of this invention in conjunction with apparatus 10 in FIG. 1 wherein anisotropic etching of ZnSe substrate 40 was performed. With reference to FIG. 7A, positive type photoresist layer 42 is spun coated on ZnSe substrate 40 and is baked for 30 to 120 minutes at 200° C. This is followed by the formation of a Ti layer 44 via electron beam sputtering or the like on photoresist layer 42. Ti layer 44 has a thickness of about 1,000 Å. Then, a second photoresist layer 46 is spun coated into Ti layer 44. As shown in FIG. 7B, a pattern 43 is then formed in photoresist layer 46 employing conventional photolithography. As illustrated in FIG. 7C, etching is performed on Ti layer 44 with photoresist layer 46 functioning as a mask. In the case of wet etching of Ti layer 42, buffer hydrofluoric acid is employed as an etchant, and in the case of dry etching of Ti layer 42, reactive ion etching (RIE) is employed using a $CF_4$ gas medium. Dry etching, wherein side etching is minimal, is preferred for producing a precision pattern 41 with negligible side etching, as illustrated in FIG. 7D. With the employment of patterned Ti layer 42 as a mask, etching of photoresist layer 42 is performed by RIE employing an oxygen plasma to form pattern 41. Particular attention must be paid to the oxygen gas pressure during the etching procedure. Generally, a pressure in the range of about 1 Pa to 10 pa is considered preferred because the etching rate becomes too slow below 1 Pa and vertical etching wherein the mask is tapered becomes impossible over 10 Pa because too much side etching. In the case where a conventional parallel plane type dry etching apparatus is employed for producing an etching mask 44 having a perpendicular cross sectional pattern without any taper, the preferred oxygen gas pressure is approximately 5 Pa. If the pressure is too high, etching progresses isotopically and, therefore, is not suitable. Ti mask 44 is removed with buffer hydrofluoric acid or the like before proceeding with the etching of ZnSe substrate 40.

Figure 7A:
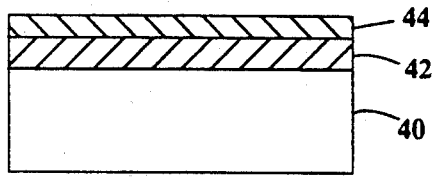
FIGS. 7A through 7E are schematic cross sectional illustrations of a ZnSe semiconductor sample for the purpose of illustrating the anisotropic nature of the etching method comprising this invention.
Figure 7B:
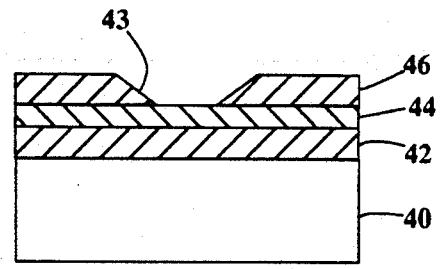
Figure 7C:
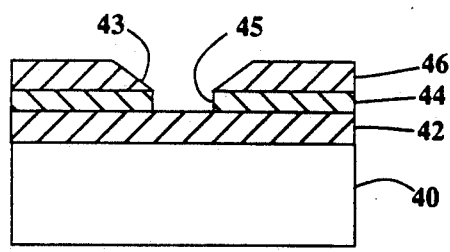
Figure 7D:
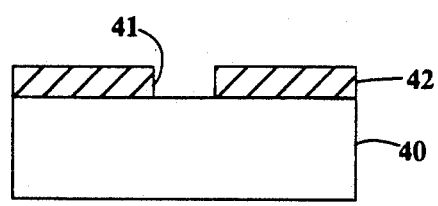
Figure 7E:
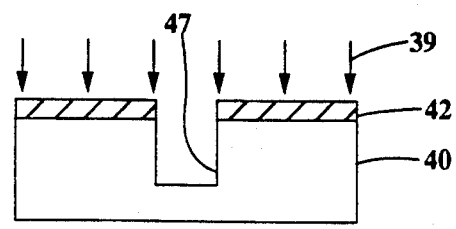

ZnSe etching is performed employing pure chlorine gas plasma under the same conditions as set forth previously relative to the use of apparatus 10 in FIG. 1, as indicated by arrows 39, and vertical cross sectional pattern 47 is obtained as illustrated in FIG. 7E. Any side etching that occurs is negligible. Therefore, the method of this invention utilized in connection with the embodiment of FIG. 7 provides anisotropy etching even though the method is complicated to some degree in the employment of several mask layers 42, 44 and 46 to form photoresist layer 42 having a pattern 41 with vertical side walls.

FIG. 8 illustrates another sample embodiment wherein etching according to this invention is accomplished at an angle relative to the planar extent of the sample by employing an ion beam that is angularly incident on the sample surface. The sample comprise a ZnSe substrate 50 upon which is formed a photoresist layer 52 having a pattern 51 formed by conventional photolithography in the same manner as in the case of FIG. 7. This is accomplished in apparatus 10 by rotation of sample holder 30 by means of control 32. FIG. 8A illustrates the state of the sample before etching and FIG. 8B illustrates the state of the sample after etching. The ion beam developed in chamber 16 is incident on ZnSe substrate 50 at a diagonal as indicated by arrows 54. Etching progresses anisotropically in ZnSe substrate 40 through the exposed regions of pattern 51 in a direction parallel to the direction of ion beam 54 resulting in the formation of a diagonal groove 56 having sides substantially parallel with the direction of beam 54. As a Group II-VI group compound semiconductor, ZnSe was employed in the embodiment of FIG. 8. However, other Group II-VI group compound semiconductors, such as $ZnS_xSe_{1-x}$ ($0 < x \leq 1$) or the like may also be employed.

Although photoresist layer 52 was employed in the foregoing sample, a mask material may be used that provides for a large difference in etching rates for different epitaxial layers, i.e., different selectivity ratios. For example, when ZnSe is to be etched, then insulating materials, such as $SiO_x$, $Si_3N_4$, $Al_2O_3$, or the like are also effective masking materials. $Al_2O_3$ masking material provides for excellent selectivity ratio relative to ZnSe and other Group II-VI compound semiconductors. $SiO_x$ and $Si_3N_4$ also provide for precision anisotropic processing, therefore, they are highly suitable as etching mask materials. The use of an $Al_2O_3$ mask material is illustrated as an embodiment in FIGS. 9. Thus, $Al_2O_3$ was employed as an etching mask 64 in this embodiment in FIG. 9A in lieu of a photoresist mask 36 illustrated in connection with FIG. 2A. Mask pattern 64 was fabricated by a liftoff process illustrated in connection with FIGS. 9A-9C. Initially, positive type photoresist pattern 62 was formed on ZnSe semiconductor substrate 60 employing conventional photolithography as illustrated in FIG. 9A. Then, $Al_2O_3$ mask layer 64 is formed, via electron beam sputtering, as illustrated in FIG. 9B. Photoresist pattern 62 is then removed with an organic solvent, such as acetone, which also removes (lifts off) portion 64A of $Al_2O_3$ layer 64 as is known in the art. As a result, $Al_2O_3$ mask 64 with pattern 66 was formed on ZnSe substrate as illustrated in FIG. 9C. While mask pattern 62 is believed to have a taper as illustrated in FIG. 9A, the resulting mask pattern 64 as a practical matter has vertical edges because the film thickness of mask pattern 62 is very thin and the selectivity ratio is large compared to ZnSe.

FIG. 10 illustrates the results of the sample shown in FIG. 9C after etching following the method of this invention. Etching was performed under the condition wherein 99.999% pure chlorine was used as the reactive gas, the gas pressure was $1.0\times10^{-1}$ Pa, the microwave inlet power was 100 W, the lead voltage was 500 V, sample temperature was 25° C., and the ion beam irradiation direction was perpendicular relative to the planar extent of substrate 60. The etching rate of ZnSe was approximately 600 Å/min. and the etching rate of the Al$_2$O$_3$ mask material was only approximately 20 Å/min. On the other hand, the etching rate of positive photoresist material, taking into account baking for 30 minutes at 120° C., is approximately 200 Å/min. This is approximately the same etching rate experienced for SiO$_2$. Thus, the selectivity of Al$_2$O$_3$ is approximately 30 times larger than compared to ZnSe and is approximately 10 times compared to photoresist and SiO$_2$. Therefore, Al$_2$O$_3$ is very effective as an etching mask for ZnSe as well as other Group II-VI compound semiconductors.

The cross sectional pattern 66 after the etching treatment was substantially perpendicular relative to the planar extent of substrate 20 thereby achieving etching with high anisotropy. The etching conditions for achieving this high selectivity for ZnSe equal to or less than 0.1 was obtained when the etching gas pressure was in the range of $5\times10^{-3}$ Pa to 1 Pa and the lead voltage was equal to or less than 1 KV.

In the case where the dominating etching mechanism is physical sputtering, a large difference in etching rates cannot be achieved. However, the large difference in etching rates is achieved when the dominating etching mechanism is chemical reaction etching performed by chemically reactive ions and radicals. In the case of the example above in connection with FIG. 10, etching was performed primary by chemically reactive ion etching.

After etching, an evaluation of the ZnSe surface condition and morphology was conducted employing the auger electron spectral diffraction method. It was noted that the presence of surface carbon was dramatically reduced compared to samples employing a photoresist mask so that a clean and substantially smooth surface was achieved.

Also, nickel, molybdenum, or tungsten were each employed as etching mask 64 in the foregoing embodiment shown in FIGS. 9 and 10. The mask was processed by same liftoff technique employed in connection with the foregoing embodiment. The nickel mask 64 was formed by electron beam sputtering. In the case of molybdenum and tungsten as a mask material, mask 64 was formed by conventional sputtering. Etching was performed under the condition wherein 99.999% pure chlorine was used as the reactive gas, the gas pressure was $1.0\times10^{-1}$ Pa, the microwave inlet power was 100 W, the lead voltage was 500 V, the sample temperature was 25° C., and the ion beam direction was perpendicular relative to the planar extent of substrate 60. The etching rate of ZnSe was found to be approximately 600 Å/min while the etching rate of the nickel mask material was approximately 100 Å/min, the etching rate of the molybdenum mask material was approximately 120 Å/min, and the etching rate of the tungsten mask material was approximately 130 Å/min. On the other hand, as indicated previously, the etching rate of baked, positive type photoresist is approximately 200 Å/min. Thus, the etching rate of nickel, molybdenum, or tungsten was approximately 0.17 to 0.22 times faster compared to ZnSe, therefore, these mask materials have high selectivity and are very effective for masking of ZnSe and other Group II-VI compound materials for the purposes of the etching method of this invention. The cross sectional pattern after etching was substantially perpendicular relative to the planar extent of the ZnSe surface providing desired anisotropy. The etching condition with this high selectivity ratio for ZnSe, being equal to or less than 0.3, was achieved when the etching gas pressure was in the range of $5\times10^{-3}$ Pa to 1 Pa and the lead voltage was equal to or less than 1 KV. As in the previous embodiment, etching was performed primary due to a chemically reactive ion generated plasma and examination of the surface revealed that the presence of surface carbon was dramatically reduced compared to samples employing a photoresist mask so that a clean and substantially smooth surface was achieved.

The next sample embodiment to be discussed involves modified microwave plasma etching apparatus 70 shown in FIG. 11 and designed to provide a dry etching method employing radical species of a halogen gas. Apparatus 70 is substantially identical to apparatus 10 shown in FIG. 1 except for rearrangement of the system, the exclusion of acceleration electrodes 26 and the provision of a constricted aperture at 72. Thus, the description relative to FIG. 1 is equally applicable to FIG. 11 so that the same numerals correspond to identical components involved and, therefore, the description will not be repeated here and is incorporated by reference thereto. ECR plasma chamber 16 is provided with aperture 72 so that it is ventilated differentially and, as a result, a lower vacuum is maintained in chamber 16 compared to etching chamber 12. In this manner, radicals are effectively lead from chamber 16 into chamber 12 to the surface of sample 28. Also, the configuration of apparatus provides for irradiation of radical species which are projected through aperture 72 into etching chamber 16 and on to sample 74 by thermal kinetic energy. FIG. 12 demonstrates one embodiment processed in connection with apparatus 70. FIG. 12A illustrates sample 74 before etching. FIGS. 12B and 12C illustrate different views of sample 74 after etching. Sample 74 comprises substrate 80 upon which is deposited a SiO$_2$ layer 82 in which pattern 83 is formed. The ZnSe surface of substrate 80 has a (001) direction. Etching mask 82 is comprised of SiO$_2$. Etching of sample 74 was performed under conditions wherein 99.999% pure chlorine gas was employed as the reactive gas, the gas pressure was $1.0\times10^{-1}$ Pa, the microwave inlet power was 100 W, and the sample temperature was 250° C. FIG. 12B is a cross sectional view from the [$\bar{1}\bar{1}0$] direction, and FIG. 12C is a cross sectional view from the [110] direction. The etching rate of ZnSe was approximately 900 Å/min. Since no ion species where involved in the etching treatment of this embodiment as in the case of previous embodiments, the cross sectional pattern 84 produced is dependent upon crystalline direction, which is the same type of pattern as in the case of employing wet etching. The etching rate has high acceptability for practical use. Also, the lateral distribution of the etching rate, relative to uniformity, in the case where substrate 80 was 20 mm × 20 mm was equal to less than ±5%, and the average distribution between batches of processed substrates 80 was equal to or less than ±7%.

Figure 13:
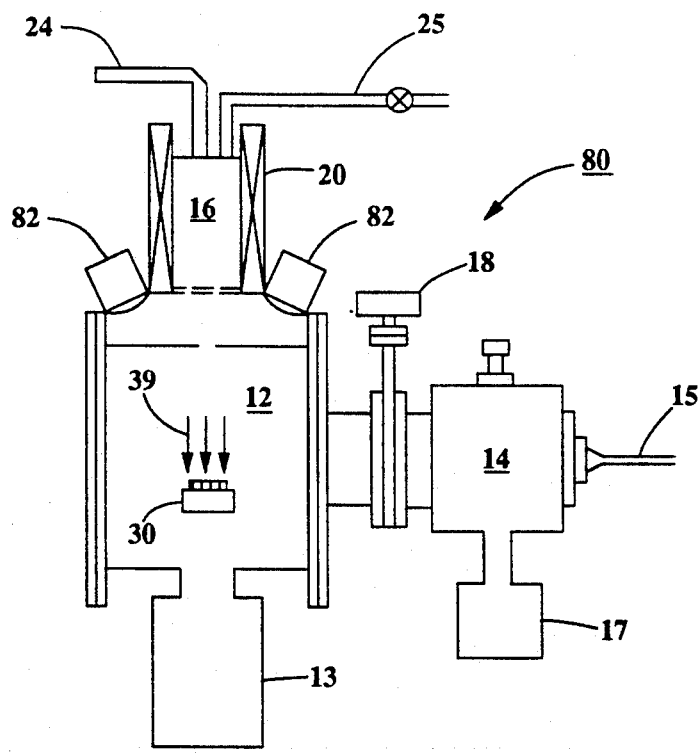
FIG. 13 is a schematic cross sectional illustration of still another microwave plasma etching apparatus employed in the practice of this invention.

The next sample embodiment to be discussed involves modified microwave plasma etching apparatus 80 shown in FIG. 13 and designed to provide a dry etching method employing light irradiation concurrently with a beam containing ion species or radical species or both such species. Apparatus 80 is substantially identical to apparatus 10 shown in FIG. 1 except for rearrangement of the system and the provision of irradiation lamps 82, which may be comprised of a suitable light source, such as, mercury lamps. Thus, the description relative to FIG. 1 is equally applicable to FIG. 13 so that the same numerals correspond to identical components involved and, therefore, the description will not be repeated here and is incorporated by reference thereto.

Etching of a sample similar to sample 28 shown in FIG. 2A was performed under conditions wherein 99.999% pure chlorine gas was employed as the reactive gas, the gas pressure was $1.0 \times 10^{-1}$ Pa, microwave inlet power was 100 W, the lead voltage was 500 V, the sample temperature was 25° C., the mercury lamp power was 200 W, and the ion beam irradiation direction was perpendicular relative to the planar extent of the substrate. The etching rate of ZnSe was approximately 1,100 Å/min. The etching rate of the post baked positive type photoresist layer was approximately 280 Å/min. Under the same treatment conditions as set forth above, another sample was etched but without the use light irradiation from lamps 82 and the etching rate was 600 Å/min. Thus, by employing light in conjunction with the etching treatment, the etching rate is increased almost by a factor of 2. Thus, apparatus 80 provides for the use of a low plasma density and a low accelerating voltage on electrodes 26 concurrent with light irradiation providing for a highly efficient etching rate that can compare or out perform the etching rate, for example, of previous discussed apparatus, with no damage to the treated semiconductor substrate or semiconductor material.

Up to this point, nothing has been said relative to the effect of temperature at the substrate during etching treatment. Sample support or holder 30 may include a heating/cooling section that provides a heating coil to heat the sample and a cooling tube system that may employ ice water to cool the sample. Also, an organic solvent, such as methanol, may be employed to cool the sample to 10° C. and below. In any case the temperature control range for the heating/cooling section is about −20° C. to 400° C.

Figure 14A:
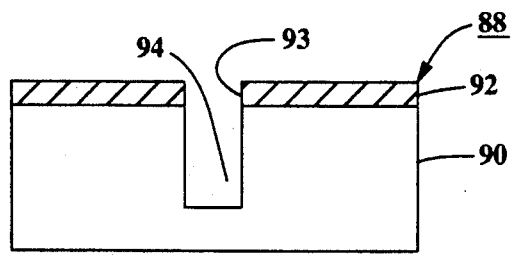
FIGS. 14A and 14B are schematic cross sectional illustrations of a ZnSe semiconductor sample for the purpose of illustrating the etching method comprising this invention as practiced in the apparatus shown in FIG. 1.
Figure 14B:
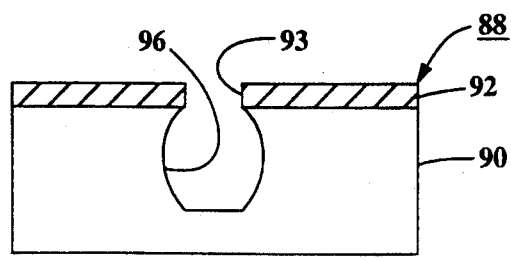

Etching of a sample 88, similar to the sample in FIG. 7D, was carried out under different substrate temperatures. Sample 88, illustrated in FIG. 14, comprised a ZnSe substrate 90 upon which is formed a positive photoresist layer 92 having a pattern 93 formed via conventional photolithography in a manner similar to that employed in FIG. 7. Etching was performed under conditions wherein 99.999% pure chlorine gas was employed as the reactive gas, the gas pressure was $1.0 \times 10^{-1}$ Pa, the microwave inlet power was 100 W, the lead voltage was 500 V, and the ion beam irradiation direction was perpendicular relative to the substrate. FIG. 14A illustrates the results due to the etching treatment where the substrate temperature was 25° C. and FIG. 14B illustrates the results due to the etching treatment where the substrate temperature was 120° C. The cross sectional shape 94 when etching was performed at 25° C. was perpendicular as shown in FIG. 14A. However, the cross sectional shape 96 when etching was performed at 120° C. was convex bulging shape as shown in FIG. 14B. When the side wall morphology was observed with a scanning electronic microscope (SEM) with 50,000 to 100,000 magnification, a smooth surface was observed in the 25° C. sample 88, but a very rough surface was observed in the 120° C. sample 88. The cause of the roughness is due to the volatile nature of chloride compounds, such as, $ZnCl_x$, $SeCl_x$, or the like, formed during the etching treatment. At lower temperatures, such as 25° C., these compounds provide a protection to the side wall of the etched region 94 from the etching action of the ion beam. However, at higher temperatures, such as 120° C., these volatile compounds evaporate almost immediately and thus provide no protection thereby causing side etching and produce undesirable surface morphology.

Figure 15:
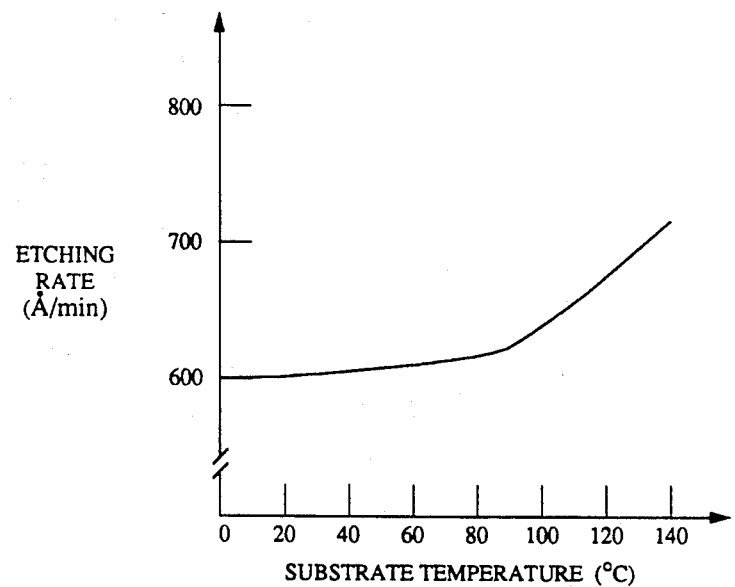
FIG. 15 is a graphic illustration of the relationship of etching rate relative to substrate temperature in the practice of the method of this invention.

FIG. 15 shows the etching rate of ZnSe as a function of substrate temperature. The temperature range within which these chloride compounds perform the function of side wall protection in an acceptable manner is approximately between 0° C. and 80° C. Beyond 80° C. they begin to evaporate. As shown in FIG. 15, the etching rate begins to rise around 80° C. When the temperature is at or below 0° C., the etching rate decreases and the substrate holder's temperature becomes much below the temperature of the surrounding environment of etching chamber 12. Therefore, chloride molecules or atoms easily attach to and remain with the sample material thereby causing difficult subsequent handling of the sample. This is because when the sample is removed from chamber 12 into the ambient, severe deterioration of the sample surface can result.

Figure 16:
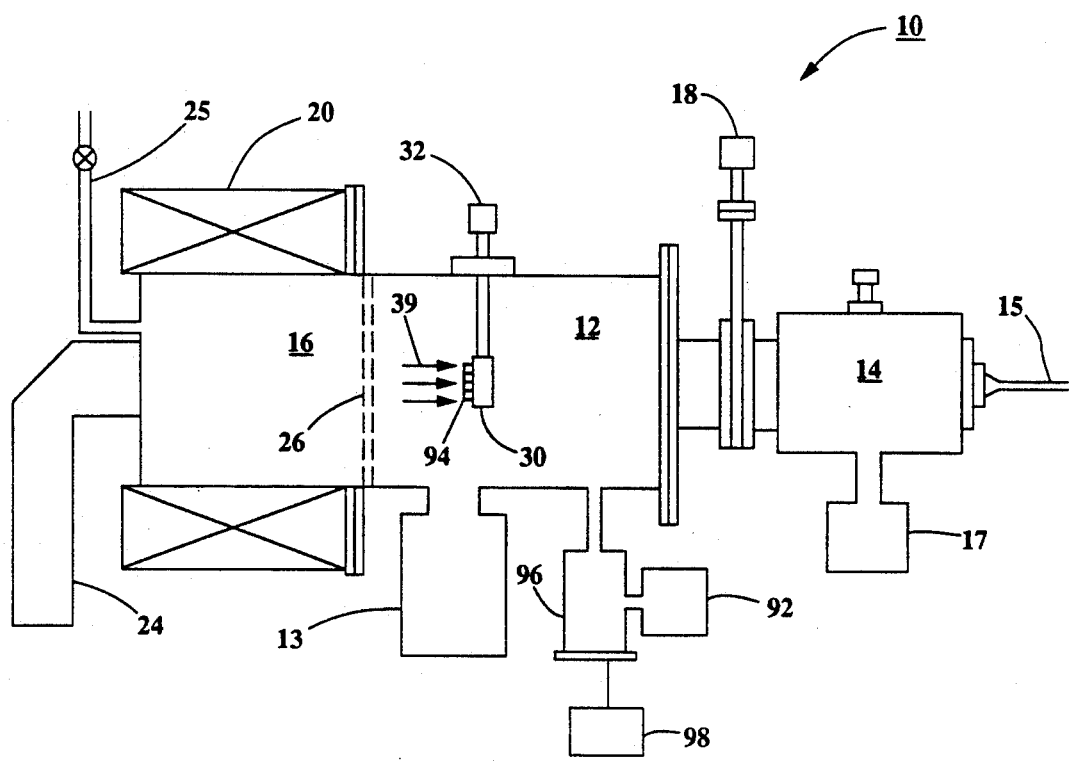
FIG. 16 is a schematic cross sectional illustration of another microwave plasma etching apparatus employed in the practice of this invention equipped to monitor etched film depth via spectrum analysis.

The next sample embodiment to be discussed involves modified microwave plasma etching apparatus 90 shown in FIG. 16 and designed to provide a dry etching method employing means for monitoring the progress of dry etching and terminate dry etching at a desired interface, e.g., at a ZnSe layer/GaAs substrate interface. Apparatus 90 is substantially identical to apparatus 10 shown in FIG. 1 except for the provision of a differential evacuation device 92 with gas analyzing tube 96 connected to etching chamber 12 so that the mass spectrum of the gas produced during etching relative to sample 94 can be observed via mass spectrum analyzing equipment 98. Thus, the description relative to FIG. 1 is equally applicable to FIG. 16 so that the same numerals correspond to identical components involved and, therefore, the description will not be repeated here and is incorporated by reference thereto.

FIG. 17 illustrates a sample 94 comprising ZnSe layer 102 deposited on a GaAs substrate or layer 100 after etching employing apparatus 90 in FIG. 16. FIG. 17A shows a cross sectional view before etching and FIG. 17B shows a cross sectional view after etching. A post baked positive type photoresist layer 104 is formed on ZnSe layer 102 and a pattern 106 is formed in layer 104 employing conventional photolithography. Sample 94 was then moved to a sample holder 30 and etching was performed under conditions wherein 99.999% pure chlorine gas was employed as the reactive gas, the gas pressure was $1.0 \times 10^{-1}$ Pa, the microwave inlet power was 100 W, the lead voltage was 500 V, the sample temperature was 25° C., and the ion beam irradiation direction was perpendicular relative to the planar extent of sample 94. The mass spectrum was observed during etching by mass spectrum analyzing equipment 98. Etching can be terminated at interface 101 between ZnSe layer 100 and GaAs layer 102 by termination of microwave power at inlet 24 when the mass spectrum for Zn and Se begins to decrease and the mass spectrum for Ga and As begins to appear. As shown in FIG. 17B, region 108 has been formed extending down to interface 101. The etching rate of ZnSe was approximately 600 Å/min. The etching rate of positive type photoresist layer 104, when the post bake condition is for 30 minutes at 120° C., is approximately 200 Å/min. Since the shape of photoresist etching mask 104 is tapered and also since etching occurs also due to physical sputtering, the final result is cross sectional tapered shape 108 shown in FIG. 17B. Perpendicular or vertical cross section cannot be achieved even though the ion treating beam is irradiated perpendicular relative to the planar extent of sample 94. However, as far as etching rate is concerned, it is adequate for practical use. The uniformity of the distribution of the etching rate across the sample, where sample 94 is 20 mm × 20 mm, was at or below ±5%, and the surface morphology was good. Since etching termination is detected by a mass spectrum rather than by etching time, there was no residual ZnSe portion remaining in region 108 and continuous etching into GaAs layer 100 could be minimized thereby achieving etching depth with high precision and reproducibility.

Microwave plasma etching apparatus 110 shown in FIG. 18 is designed to provide the dry etching method of this invention including means to monitor the depth of etching as well as the point of termination or interface of a layer being etched. Apparatus 110 is substantially identical to apparatus 10 shown in FIG. 1 except for the provision of additional apparatus to monitor the refractive index and thickness of material in the process of being etched and evacuated from the system of apparatus 110. Thus, the description relative to FIG. 1 is equally applicable to FIG. 18 so that the same numerals correspond to identical components involved and, therefore, the description will not be repeated here and is incorporated by reference thereto.

Etching chamber 12 of apparatus 110 includes an optical inlet port 112 and an optical outlet port 114 for the purpose of ellipsometry. Light is emitted from light source 116 at the region of inlet port 112, is collimated by lens 118 and is then linearly polarized via polarizer 120. The light is then circularly polarized via ¼ frequency plate 122. The light becomes linearly polarized after being reflected from sample 94 and is transmitted through outlet port 114 and is received by photomultiplier tube 128 via polarizer 126. The rotation angle brought about by polarizer 120 and polarizer 126 and the information developed from photomultiplier tube 128 are analyzed by data analyzing device 130 to obtain data relative to the refractive index of the material being etched and the depth of thickness of the etched ZnSe film 102.

Refractive index and film thickness of ZnSe sample 94 exposed through mask pattern 106 are continuously monitored and measured by ellipsometry during etching treatment. When the desired depth or thickness of sample is reached, microwave power at inlet 24 is terminated. Since refractive index changes significantly when etching process reaches interface 101 between ZnSe layer 102 and GaAs layer 100, etching can be easily terminated. Since etching termination is detected by ellipsometry rather than by etching time, there was no residual ZnSe portion remaining in region 108 and continuous etching into GaAs layer 100 could be minimized thereby achieving the desired etching depth with high precision and reproducibility.

Figure 19:
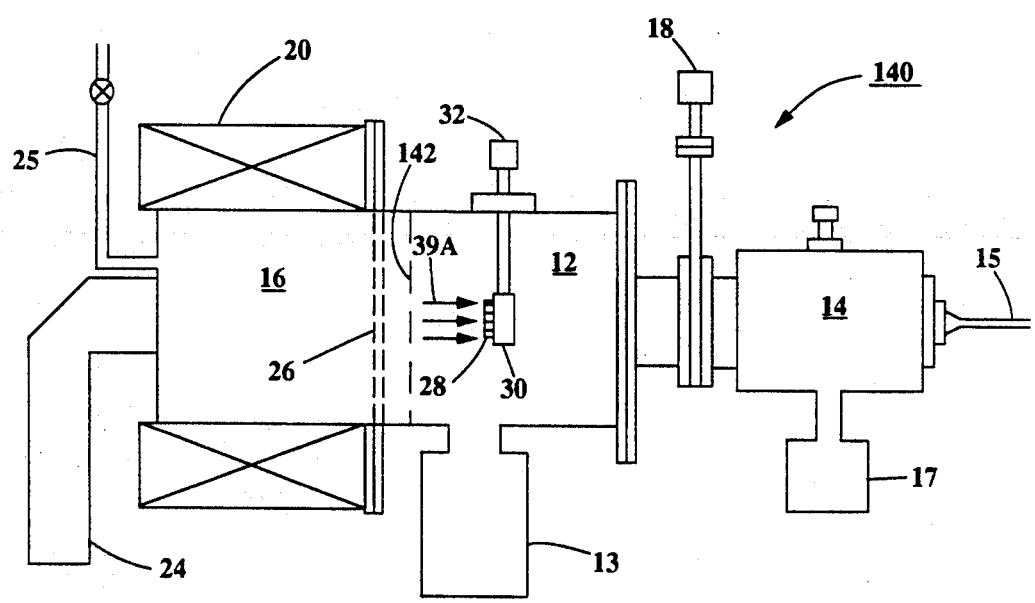
FIG. 19 is a schematic cross sectional illustration of a still further microwave plasma etching apparatus employed in the practice of this invention.

Apparatus 140 in FIG. 19 is substantially identical to apparatus 10 shown in FIG. 1 except for the provision of triode electrode means. Thus, the description relative to FIG. 1 is equally applicable to FIG. 19 so that the same numerals correspond to identically disclosed components and, therefore, the description will not be repeated here and is incorporated by reference thereto.

In addition to the dual mesh grid electrode 26, there is also provide electrode 142 to which a counter bias is applied so that electrode 142 functions, similar to the function of a grid in a triode tube, by lowering the energy of the accelerated ion beam from plasma generating chamber 16. As known in the art, grid electrode 26 accelerates ions from the plasma while generally maintaining in plasma chamber 16 other plasma created species. The problem with prior art methods utilizing such an ion extraction or acceleration grid, particularly with respect to the employment of the RIBE method, however, is that it is necessary to operate under a lower lead voltage, such as 300 V, preferably less than this value, in order to prevent damage to crystalline structure of a Group II-VI compound semiconductor to be etched. As a result, the ion beam energy is lowered so that that less damage to the sample is likely to occur. However, the lowering of the lead voltage also correspondingly lowers the plasma density established in chamber 16 so that the plasma becomes unstable and lacks control in that the ions lose their directionality. As a result, lower etching rates, which are not suitable for practical etching applications, occurs as well as isotropic etching occurs. However, by applying a counter bias at electrode 142, positioned after mesh grid electrode 26, electrode 26 in this embodiment may be maintained at a higher operating voltage, such as 500 V, to maintain plasma stability in chamber 16 as well as maintain a high plasma density while counter bias electrode 142 lowers the energy of the ion beam so that an ion beam 39A at sample 28 is obtained that characterized by a high density and a lower energy level thereby rendering it possible to achieve a RIBE dry etching with low damage to the crystalline structure and with high anisotropy.

A specific example of the forgoing embodiment is as follows. The etching gas was 99.999% pure chlorine gas, the gas pressure was $1.0 \times 10^{-1}$ Pa, the microwave inlet power was 100 W, the lead voltage on electrodes 26 was −500 V (when individual electrode of electrodes 26 at the plasma chamber side is set to 0 V) and the control voltage on electrode 142 is at +200 V. The ion current density at this time is 400 $\mu A/cm^2$. The variation of ion current density is within ±5% when the control voltage is varied in the range of 0 V to 400 V. Therefore, etching can be accomplished at very low control voltages and virtually at 0 V. Thus, an ion beam having low energy with a high density can be obtained having good controllability for anisotropic dry etching. The resultant etching rate of a ZnSe sample 28 was 600 Å/min. On the other hand, the etching rate of positive photoresist material, taking into account baking for 30 minutes at 120° C., is approximately 200 Å/min. Further, the uniformity in distribution of the etching rate on the etched material across the extent of the sample surfaces was about or less than ±3%, and the surface morphology of the sample was about the same as the surface morphology before etching treatment, i.e., there was no deterioration to the photoluminescence properties or physical properties because of the dry etching process.

When control electrode 142 is inserted between the sample being treated and ion lead electrode 26, the kinetic energy of the ion beam applied to the sample being treated, the ion beam current density, and the microwave power for ECR excitation can be independently controlled. Therefore, ion beam etching at very low or zero control voltages, which was virtually impossible in prior art methods and apparatus, is possible with apparatus 140 thereby enabling control relative to the etching shapes to be performed on the ZnSe sample. Thus, employing apparatus 140, it is possible to easily form various shapes, such as, a mesa, inverted mesa, a vertical plane and the like, on the sample being treated in chamber 12.

Also, since damage to the material being treated and the etching amount per unit time can be controlled independently, the optimum parameters can be selected by a selected composition ratio when etching a ZnSSe mixed crystal or the like.

Thus, by making the negative voltage applied to lead electrode 26 large and the positive voltage applied to control electrode 142 large, an ion beam having a large ion current with low ion energy can be obtained. Thus, dry etching of II-VI compound semiconductor, which material is easily damaged by high ion impact energy, can be achieved without damage because a low lead voltage, i.e., between 0 V to 400 V, can be utilized in apparatus 140 producing an ion beam of low acceleration with the generation of a high density plasma.

It should be noted that while the forgoing example of this invention is relative to Group II-VI compound semiconductors the practice of the method of this invention relative to apparatus 140 is equally applicable to Group III-V compound semiconductors as well as other types of compound materials wherein an ion beam having a large ion current with low ion energy can be obtained for etching such materials without damage.

Figure 20:
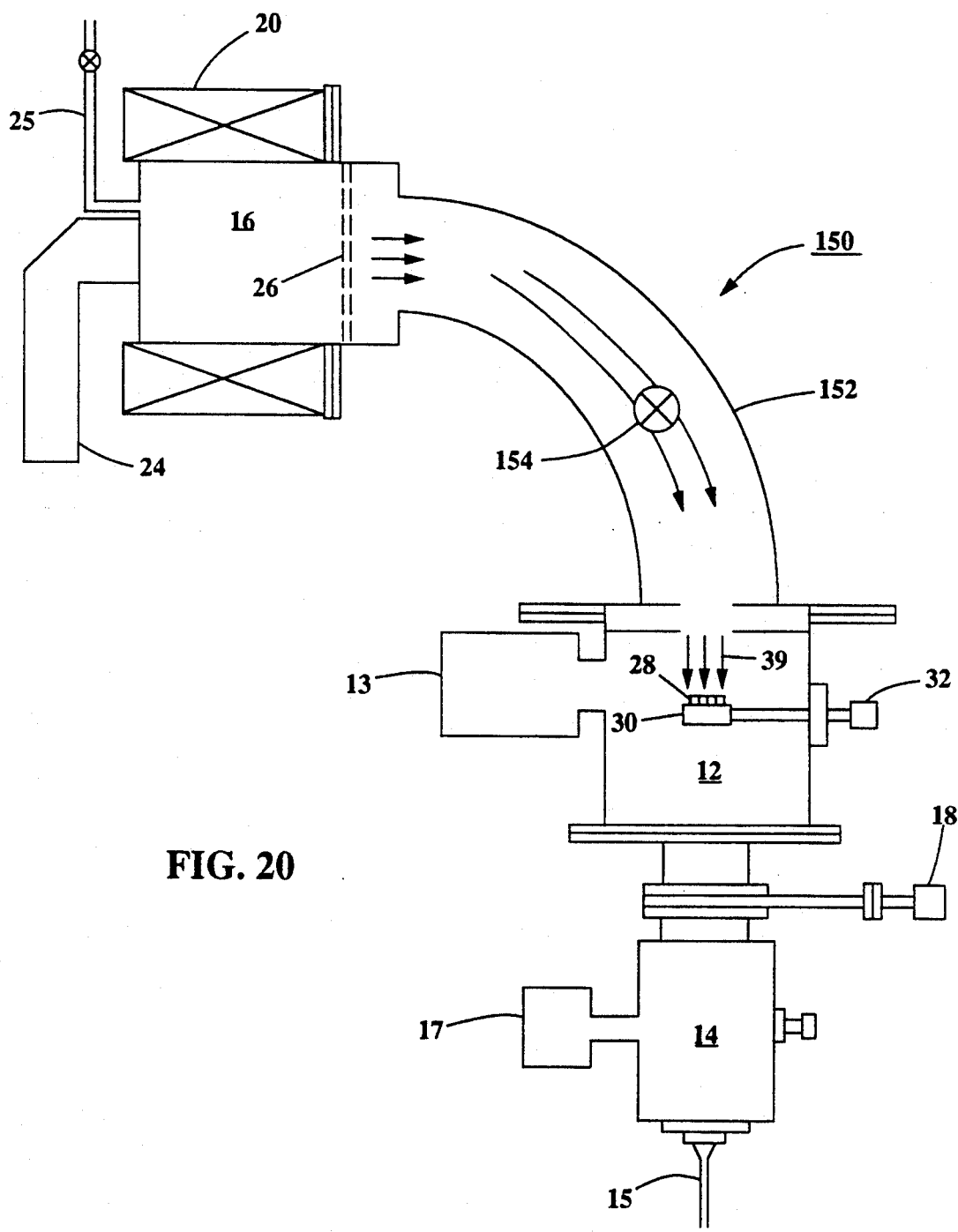
FIG. 20 is a schematic cross sectional illustration of a still even further microwave plasma etching apparatus employed in the practice of this invention.

Apparatus 150 in FIG. 20 is substantially identical to apparatus 10 shown in FIG. 1 relative to components comprising the etching system except for the physical arrangement of the system and the provision of a connecting conduit 152 between plasma chamber 16 and treatment chamber 12 and the employment of a magnetic field represented by the symbol 154. Thus, the description relative to FIG. 1 is equally applicable to FIG. 20 so that the same numerals correspond to identically disclosed components and, therefore, the description will not be repeated here and is incorporated by reference thereto.

In apparatus 150, an intermediate region or chamber 152 is provided between treatment chamber 12 and plasma generating chamber 16, such as conduit 152, is preferably a curved conduit, e.g., 90° as shown in FIG. 20, but also may be a straight-through conduit. Magnetic field generating means 154 is positioned so as to establish a magnetic field through conduit 152, which field is transverse to the elongated extent of conduit, e.g., perpendicular to the length of conduit 152. The purpose of this transverse magnetic field 154 is to remove specific ion species from the accelerated ion beam that interfere in the controllability and directionality of the ion beam. Transverse magnetic field 154 is applied in order to produce an ion beam with only monovalent $Cl^+$ ions. Radicals, such as $Cl^*$ and $Cl_2^*$, do not proceed with the beam into chamber 12 because they are affected by the magnetic field. Likewise, ions, such as $Ar^+$, $Fe^+$, $O^+$, $N^+$, or bivalent ions, such as, $Cl^{2+}$, which mix in the ion beam as impurities, do not proceed into chamber 12 because they are affected differently by magnetic field 154, vis a vis monovalent $Cl^+$ ions, due to their difference in mass spectrum and ion valence.

Also, these other radical and ion species, beside monovalent Cl ion species, interfere in the controllability of the beam in chamber 12 because the difference in reactive levels of the reaction products formed by these other radical and ion species upon etching of the surface of sample 28. In other words, some reactive products formed are more reactive than other formed reaction products. Also, directionality of these less active radical species and heavier mass ion species is less compared to the more active radical and ion species desired to produce the dry etching function. The application of transverse magnetic field 154 removes neutral radical species and low reactive, ion species flowing through conduit 152 in the ion beam prior to the ion beam reaching sample 28. Therefore, only the highly directional, highly active ion species, i.e., $Cl^+$ species, travel into chamber 12 thereby rendering it possible to achieve a low energy RIBE beam for dry etching with no or negligible damage to the sample crystalline structure and providing high anisotropy.

When a plasma generated ion beam is irradiated onto a sample employing low acceleration voltages, e.g., 0 V to 400 V, various impurity ions become sources of interference with the etching progress. For example, the plasma species generated in apparatus 10 and 150 from chamber 16 in FIGS. 1 and 20 generally consist of, for example, $Cl^+$, $Cl_2^+$, $Cl^{4+}$, $Cl^{2+}$, $Cl^*$, $Cl_2^*$, $C^+$, $Ar^+$, $Fe^+$, $O^+$, $N^+$. Among these species, plasma species beside $Cl^+$, i.e., species such as $C^+$, $Ar^+$, $Fe^+$, $O^+$, $N^+$ and the like, interfere with the progress and uniformity of etching. Also, radical species, such as, $Cl^*$ and $Cl_2^*$ and the like, interfere with anisotropic etching, i.e., vertical etching, because these radical species lack directionality and their use in etching depends on sample crystalline orientation which is similar to the case of wet etching. Further, when there is a plurality of majority ion species, such as $Cl^+$ and $Cl_2^+$ and if there is a change in the existence ratio, the controllability of etching rate becomes poor. Thus, etching with good controllability, anisotropic etching, and etching with clean surface can be achieved when etching is performed via one kind of ion species, such as $Cl^+$ ion species.

The device shown in FIG. 20 utilizes a magnetic field between plasma generating chamber 16 and treatment chamber 12 in order to remove specific plasma species, e.g., $Cl_2^+$, $Cl^*$, $Cl_2^*$, $C^+$, $Ar^+$, $Fe^+$, $O^+$, $N^+$ or the like, for the reasons described above. Magnetic field 154 is generated by a controlling magnetic circuit transversely against an accelerated ion generated beam from plasma chamber 16. This magnetic field in combination with the curved portion of conduit 152 remove out of the beam radical species, such as $Cl^*$ and $Cl_2^*$, and ion species, such as, $Cl_2^+$, $Cl^{+4}$, $Cl^*$, $Cl_2^*$, $C^+$ and $Fe^+$, affected by the magnetic field and centrifugal forces created on the larger mass ion species in the curved conduit 152 wherein substantially only $Cl^+$ species remain in the ion beam entering into chamber 12 for impingement on and etching treatment of the surface of sample 28 thereby enabling practical dry etching properties at low voltage levels that will not cause damage to the sample surface.

A specific example of the forgoing embodiment is as follows, employing the apparatus shown in FIG. 20. The etching gas was 99.999% pure chlorine gas, the gas pressure was $1.0 \times 10^{-1}$ Pa, the microwave inlet power was 100 W, the lead voltage on electrodes 26 was 200 V, the magnetic flux density of the controlling magnetic circuit was 3K gauss. Etching rates comparable to previous embodiments were achieved but at lower lead voltages. When the surface of sample 28 was examined after etching, substantially no impurities, such as, Fe, C and the like, were detected.

Thus, dry etching of II-VI compound semiconductor, which material is easily damaged by high ion impact energy, can be achieved without damage because a low lead voltage, i.e., between 0 V to 400 V, can be utilized in apparatus 150 producing an ion beam of low acceleration with the generation of a high density plasma with undesired species removed from the ion beam.

It should be noted that apparatus 150 is equally applicable to dry etching of both Group II-VI and Group III-V compound semiconductors as well as other types of compound materials wherein an ion beam having a large ion current with low ion energy can be obtained for etching such materials without damage and with high anisotropy.

The feature of the counter bias electrode 142 in FIG. 19 may be combined with the feature of the transverse magnetic field 154 in FIG. 20 to provide a RIBE dry etching process in providing an ion beam that has a selected treatment species and characterized with low acceleration and high density plasma resulting in high anisotropy and no or negligible damage to the crystalline structure sample while providing for controlled but enhanced etching rates.

While the invention has been described in conjunction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. In a method of reactive ion beam etching of Group II-VI compound semiconductors comprising the steps of
   forming a patterned mask on the surface a Group II-VI compound semiconductor,
   positioning the Group II-VI compound semiconductor in a treatment chamber, dry etching the Group II-VI compound semiconductor,
   activating chlorine gas in a microwave excitation ECR plasma chamber coupled to said treatment chamber for said Group II-VI compound semiconductor forming a reactive gas plasma containing reactive ion species or radial species or a combination thereof and
   irradiating said sample with a beam of said species formed from said reactive gas plasma.

2. The method of reactive ion beam etching of Group II-VI compound semiconductors of claim 1 including the step of providing a first electrode means to form a bias in the vicinity of the exit of said plasma chamber to maintain a high density plasma in said plasma chamber while accelerating said species to form said beam directed from said plasma chamber to said Group II-VI compound semiconductor in said treatment chamber and providing a second electrode means between said first electrode means and said Group II-VI compound semiconductor to apply a counter bias to said beam to lower the energy of said beam prior to impinging on said Group II-VI compound semiconductor thereby preventing significant crystalline damage to said Group II-VI compound semiconductor.

3. The method of reactive ion beam etching of Group II-VI compound semiconductors of claim 2 including the step of providing a magnetic field between said second electrode and said treatment chamber transverse to the direction of flow of said beam to substantially remove all species from said beam except for a monovalent active species thereby improving the reactionary quality of said beam on said Group II-VI compound semiconductor.

4. The method of reactive ion beam etching of Group II-VI compound semiconductors of claim 3 wherein said transverse magnetic field is applied through a curved conduit connecting said plasma chamber with said treatment chamber.

5. The method of reactive ion beam etching of Group II-VI compound semiconductors of claim 2 including the step of providing a magnetic field between said second electrode and said treatment chamber, said magnetic field being transverse to the direction of flow of said beam, said magnetic field removing undesired species from said beam thereby improving the reactionary quality of said beam on said Group II-VI compound semiconductor.

6. The method of reactive ion beam etching of Group II-VI compound semiconductors of claim 1 wherein said mask comprises an insulating material selected from the group consisting of photoresist, silicon oxide, silicon nitride and aluminum oxide.

7. The method of reactive ion beam etching of Group II-VI compound semiconductors of claim 1 wherein said mask comprises a metal material selected from the group consisting of molybdenum, nickel or tungsten.

8. The method of reactive ion beam etching of Group II-VI compound semiconductors of claim 1 including the step of maintaining the temperature of said Group II-VI compound semiconductor within the range of about 0° C. to 80° C. during the step of irradiation.

9. The method of reactive ion beam etching of Group II-VI compound semiconductors of claim 1 including the step of measuring the mass spectrum reaction products during the etching of said Group II-VI compound semiconductor and terminating the etching process when a substantial change occurs in the mass spectrum.

10. The method of reactive ion beam etching of Group II-VI compound semiconductors of claim 1 including the step of measuring the refractive index and thickness of said sample employing ellipsometry and terminating the etching process when a substantial change occurs in the refractive index of the Group II-VI compound semiconductor material being etched or a predetermined thickness of the etched Group II-VI compound semiconductor is attained.

11. The method of reactive ion beam etching of Group II-VI compound semiconductors of claim 1 including the step of providing a magnetic field between said plasma chamber and said treatment chamber, said magnetic field being transverse to the direction of flow of said beam, said magnetic field removing undesired species from said beam thereby improving the reactionary quality of said beam on said Group II-VI compound semiconductor.

12. A method of dry etching of Group II-VI compound semiconductors employing a microwave plasma etching apparatus comprising a plasma generating chamber for forming a high density plasma and directing reactive species from said plasma as a substantially unidirectional beam into an adjoining treatment chamber containing a Group II-VI compound semiconductor sample to be etched, comprising the steps of:
   providing a Group II-VI compound semiconductor sample in said treatment chamber,
   evacuating said treatment chamber, supplying chlorine gas in said plasma generating chamber, applying microwave energy in combination with a magnetic field to said plasma chamber to from an ECR microwave plasma source therein containing reactive species, directing a beam of said reactive species from said plasma to said sample for dry etching said sample, said method characterized in that the pressure in said chambers is in the range of about $5 \times 10^{-3}$ Pa to 1 Pa, the microwave inlet power is in the range of about 1W to 1 KW and the lead voltage is in the range of about 0 V to 1 KV thereby forming a high density plasma with a low ion energy level providing enhanced anisotropic etching without damage to the crystalline structure of said sample.

13. The method of dry etching of claim 11 including the steps of:

forming a first masking layer on the surface of said sample to be etched, forming a second masking layer over said first masking layer, selectively etching said second masking layer forming a first masking pattern, selectively etching a second pattern, being a replication of said first pattern, in said first masking layer wherein the etching is characterized by anisotropically forming a pattern in said first masking layer that contains substantially vertical side walls in said second pattern, and thereafter applying the steps of claim 11 anisotropically forming a third pattern in said sample, being a replication of said second pattern and containing substantially vertical side walls due to the substantially vertical side walls formed in said second pattern and the anisotropic nature of said etching method.

14. The method of dry etching of claim 13 wherein said first masking layer is photoresist, said second masking layer is titanium and said selective second pattern etching step comprises ion beam etching performed in an oxygen plasma.

15. The method of dry etching of claim 11 including the steps of:

forming a first masking layer on the surface of said sample to be etched, selectively etching said first masking layer forming a first masking pattern, choosing a material for a second masking layer wherein the selectivity ratio between said second masking material and said sample is high, forming said second masking layer over said first masking pattern, removing said first masking pattern together with portions of said second masking layer formed directly on said first masking layer forming a second masking pattern, and thereafter applying the steps of claim 11 anisotropically forming a third pattern in said sample, being a replication of said second pattern and containing substantially vertical side walls in said third pattern due to the substantially vertical side walls formed in said second pattern and the anisotropic nature of said etching method.

16. The method of dry etching of claim 15 wherein said first masking layer is selected from the group consisting of $SiO_x$, $Si_3N_4$, $Al_2O_3$, nickel, molybdenum and tungsten, said second masking layer comprising photoresist.

17. The method of dry etching of Group II-VI compound semiconductors of claim 12 including the step of providing a first electrode means to form a bias in the vicinity of the exit of said plasma chamber to maintain a high density plasma in said plasma chamber while accelerating said species to form said beam directed from said plasma chamber to said sample in said treatment chamber and providing a second electrode means between said first electrode means and said sample to apply a counter bias to said beam to lower the energy of said beam prior to impinging on said sample thereby preventing significant crystalline damage to said sample.

18. The method of dry etching of Group II-VI compound semiconductors of claim 17 including the step of providing a magnetic field between said second electrode and said treatment chamber, said magnetic field being transverse to the direction of flow of said beam, said magnetic field removing undesired species from said beam thereby improving the reactionary quality of said beam on said sample.

19. The method of dry etching of Group II-VI compound semiconductors of claim 12 including the step of maintaining the temperature of said sample within the range of about 0° C. to 80° C. during the step of etching said sample.

20. The method of dry etching of Group II-VI compound semiconductors of claim 12 including the step of measuring the mass spectrum of reaction products formed during the etching of said sample and terminating the etching process when a substantial change occurs in said mass spectrum.

21. The method of dry etching of Group II-VI compound semiconductors of claim 12 including the step of measuring the refractive index and etched thickness of said sample employing ellipsometry and terminating the etching process when a substantial change occurs in the refractive index of the sample material being etched or a predetermined thickness of the etched sample is attained.

22. The method of dry etching of Group II-VI compound semiconductors of claim 12 including the step of providing a magnetic field between said plasma chamber and said treatment chamber, said magnetic field being transverse to the direction of flow of said beam, said magnetic field removing undesired species from said beam thereby improving the reactionary quality of said beam on said sample.

23. The method of dry etching of Group II-VI compound semiconductors of claim 12 wherein said lead voltage is preferably 0 V to 600 V.

24. The method of claim 12 maintaining said lead voltage at 0 V and maintaining the temperature of said sample around 200° C. during the step of etching said sample.

25. In a method of reactive ion beam etching of Group II-VI compound semiconductors comprising the steps of forming a patterned mask on the surface a Group II-VI compound semiconductor, positioning the Group II-VI compound semiconductor in a treatment chamber, dry etching the Group II-VI compound semiconductor, activating chlorine gas in a microwave excitation ECR plasma chamber coupled to said treatment chamber for said Group II-VI compound semiconductor forming a reactive gas plasma containing reactive ion species or radial species or a combination thereof, irradiating said sample with a beam of said species formed from said reactive gas plasma, providing a magnetic field between said plasma chamber and said treatment chamber transverse to the direction of flow of said beam to substantially remove all species from said beam except for a monovalent active species thereby improving the reactionary quality of said beam on said Group II-VI compound semiconductor.

26. The method of reactive ion beam etching of Group II-VI compound semiconductors of claim 25 wherein said transverse magnetic field is applied through a curved conduit connecting said plasma chamber with said treatment chamber, said ion beam comprises monovalent Cl+ ions.

27. The method of reactive ion beam etching of Group II-VI compound semiconductors of claim 25 including the step of providing a conduit between said plasma chamber and said treatment chamber for applying said magnetic field and restricting the cross sectional extent at the entrance to said treatment chamber between said conduit and said treatment chamber so that said entrance is smaller than internal cross sectional extent of said conduit.

28. A method of dry etching of Group II-VI compound semiconductors employing a microwave plasma etching apparatus comprising a plasma generating chamber for forming a high density plasma and directing reactive species from said plasma as a substantially unidirectional ion beam into an adjoining treatment chamber containing a Group II-VI compound semiconductor sample to be etched, comprising the steps of:

providing a Group II-VI compound semiconductor sample in said treatment chamber, evacuating said treatment chamber, supplying chlorine gas in said plasma generating chamber, applying microwave energy in combination with a magnetic field to said plasma chamber to from an ECR microwave plasma source therein containing reactive species, directing a beam of said reactive species from said plasma to said sample for dry etching said sample, providing a magnetic field between said plasma chamber and said treatment chamber transverse to the direction of flow of said beam to substantially remove all species from said beam except for a monovalent active species thereby improving the reactionary quality of said beam on said sample, and applying the pressure in said chambers in the range of about $5 \times 10^{-3}$ Pa to 1 Pa, the microwave inlet power is the range of about 1W to 1 KW and the lead voltage in the range of about 0 V to 1 KV thereby forming a high density plasma with a low ion energy level providing enhanced anisotropic etching without damage to the crystalline structure of said sample.

29. The method of dry etching of claim 28 wherein said transverse magnetic field is applied through a curved conduit connecting said plasma chamber with said treatment chamber, said ion beam comprises monovalent Cl+ ions.

* * * * *